United States Patent
Talroze et al.

(12) 
(10) Patent No.: US 6,563,132 B1
(45) Date of Patent: May 13, 2003

(54) CONDUCTIVE POLYMER MATERIALS AND METHODS FOR THEIR MANUFACTURE AND USE

(75) Inventors: Raisa V. Talroze, Novato, CA (US); Leonid N. Grigorov, Novato, CA (US)

(73) Assignee: Quantum Polymer Technologies Corp., Santa Rosa, CA (US)

( * ) Notice: Subject to any disclaimer, the term of this patent is extended or adjusted under 35 U.S.C. 154(b) by 0 days.

(21) Appl. No.: 10/054,315

(22) Filed: Jan. 22, 2002

Related U.S. Application Data

(60) Provisional application No. 60/263,386, filed on Jan. 23, 2001.

(51) Int. Cl.$^7$ .............................................. H01L 51/00
(52) U.S. Cl. .......................... 257/40; 257/613; 438/99
(58) Field of Search .............................. 257/40, 14, 25, 257/30, 613; 438/99

(56) References Cited

U.S. PATENT DOCUMENTS

| | | | |
|---|---|---|---|
| 4,325,795 A | * 4/1982 | Bourgoin | ................ 204/180 R |
| 5,777,292 A | * 7/1998 | Grigorov et al. | ...... 204/157.15 |
| 6,294,450 B1 | * 9/2001 | Chen et al. | .................. 438/597 |
| 6,407,443 B2 | * 6/2002 | Chen et al. | .................. 257/616 |

* cited by examiner

*Primary Examiner*—Sara Crane
(74) *Attorney, Agent, or Firm*—Fliesler, Dubb, Meyer & Lovejoy LLP

(57) ABSTRACT

Quantum nanowires are produced in a medium comprising ions, dopants and free electrons, wherein the free electrons are solvated by complexes of ions and dopants. Electrical conductivity of the quantum nanowires can be higher than for conventional metal conductors. Quantum nanowires can be prepared in linear or circular form, and can be used to manufacture electrical components including transistors, sensors, motors and other nanoscale passive or active devices. Nanoscale devices can be made in liquid, semisolid, or solid media. Methods are provided for the manufacture of quantum nanowires and devices made therefrom. The devices can be used in the manufacture of computers, electronic circuits, biological implants and other products.

14 Claims, 31 Drawing Sheets

Too high potential "bump"
cuts one superpolaron to two independent ones

CONDUCTIVE POLYMER MATERIALS AND METHODS FOR THEIR MANUFACTURE AND USE

RELATED APPLICATIONS

This application claims priority to U.S. Provisional Patent Application Serial No: 60/263,386, filed Jan. 23, 2001. This provisional patent application is herein incorporated fully by reference.

BACKGROUND OF THE INVENTION

1. Field of the Invention

This invention relates to conductive polymer materials, and to conductive polymer materials having organic ions, a dopant and solvated free electrons. This invention also relates to conductive polymer materials used in microelectronics, optoelectronics and biomedicine.

2. Description of Related Art

Electrical conductors play fundamental roles in many aspects of modem technology. Technological advances in computers relies upon conductors that have low resistance. The energy required to move electrical current through a conductor is related to the resistance. To maintain operating temperatures, resistive energy losses, including heat, must be dissipated by devices containing conductors. To minimize the energy required and the energy dissipation necessary, it is desirable to provide conductors having very high conductivity and low resistance. Because many applications occur at temperatures near room temperature, it is especially desirable to provide conductors that have very high conductivity at near room temperature.

Metals and metal alloys are widely used as electrical conductors in many applications, including semiconductor applications. Metal conductors are characterized by the presence of a crystal lattice having no chemical bonds between metal and other atoms. Metals and alloys have resistance low enough and conductance high enough (about $10^6$ S/cm) to be useful for many applications. However, the resistance of these materials is sufficiently high as to require significant energy for their operation, and their use results in substantial power losses.

A major advance in conduction occurred with the discovery in 1911 by Onnes, that below a certain critical temperature, certain metals can become superconductors, that is, have resistance to direct current (DC) approaching zero. The low resistance is related to conductivities greater than about $10^6$ S/cm. Unfortunately, the critical temperatures for most metals is very low, typically a few Kelvins (K). This low temperature requirement severely limits the application of metal superconductors for room temperature applications.

Another significant advance occurred in 1987 with the discovery that certain ceramic oxides can become superconductors below critical temperatures of about 100 K. Although the critical temperature is substantially higher for ceramic oxide superconductors than for metal conductors, the temperatures are so low as to make room temperature applications expensive and difficult.

U.S. Pat. No. 4,325,795 (incorporated herein fully by reference) discloses methods of manufacturing and materials composed of greater than 10% by weight powdered bismuth metal suspended in epoxy resin, a dielectric polymer. In this process, the bismuth and epoxy form small filaments having diameters in the range of about 10 Å to about 1000 Å. The conductivity of the filaments exceeds that of metals (i.e., $10^6$ S/cm) at room temperatures.

Theoretical analyses by W. A. Little (Physical Reviews 134:A1416 (1964), incorporated herein fullyby reference), provided a basis for the formation of superconducting poly-conjugated polymers having quasi-one-dimensional structures. Little's theories has led to the discovery of certain highly conductive polymer systems, including polyacetylene. When doped, polyacetylene can exhibit conductivity near that of metals (i.e., about $10^5$ S/cm). Another type of highly conductive polymer was discovered by Grigorov et al., (Polymer Science 35:(11):1625–1633 (1993), incorporated herein fully by reference). These polymers include undoped oxidized a tactic polypropylene and polydimethylsiloxane, which are reported to provide structures having conductances greater than $10^{11}$ S/cm.

U.S. Pat. No. 5,777,292 (incorporated herein fully by reference) discloses organic macromolecular matrices containing conducting threads having conductances above $10^6$ S/cm.

BRIEF DESCRIPTION OF THE FIGURES

The invention will be described with respect to the particular embodiments thereof. Other objects, features, and advantages of the invention will become apparent with reference to the specification and drawings in which:

FIG. 12a depicts a stage in which the circular superpolaron is not completed and an electrical current in a linear superpolaron induces a magnetic field within the incomplete circular superpolaron.

FIG. 12b depicts a stage in the creation of a persistent electrical current in the superpolaron of this invention after completing the circular superpolaron.

FIG. 14a depicts a state in which a low potential "bump" does not separate the superpolaron depicted in FIG. 13, and thereby does not provide a barrier to the flow of electrical current.

FIG. 14b depicts a state in which a high potential "bump" is sufficient to separate the superpolaron of FIG. 13 into two smaller superpolarons, thereby providing a barrier to the flow of electrical current.

FIG. 16a depicts a linear superpolaron having two contacts and a gate (G1), and a circular superpolaron having a gate (G2). No current is in the circular superpolaron, and this condition can be considered logic state 0. FIG. 16b depicts an incomplete circular superpolaron wherein a current in the linear superpolaron creates a magnetic field.

FIG. 16c depicts the element as depicted in FIG. 16a having a completed circular superpolaron.

FIG. 16d depicts the element as depicted in FIG. 16c, but after the linear current in the linear superpolaron is off, resulting in a persistent current in the circular superpolaron. This state can be considered to be logic state 1.

FIG. 18a depicts a trinary element after having been written, wherein a persistent electrical current in one direction is created in a circular superpolaron. This state can be considered logic state +1.

FIG. 18b depicts a trinary logic element as depicted in FIG. 18a, but wherein the persistent current in the circular superpolaron is in a direction opposite to that depicted in FIG. 18a. This state can be considered logic state −1.

FIG. 23a depicts a state wherein the density N of the bottom phase of the switch is higher than the density n of the top phase. The difference in density causes an incident beam of electromagnetic radiation to be reflected back into the dense medium and no light passes through the switch.

FIG. 23b depicts a state wherein the density n of the top phase has been increased to near the density N of the bottom phase. In this state, light can pass through the switch.

SUMMARY OF THE INVENTION

Figure 1:
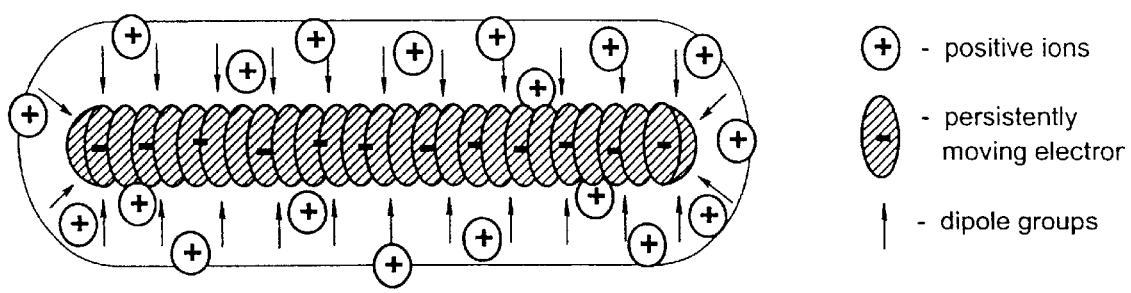
FIG. 1 depicts a superpolaron of this invention.

The present invention provides methods of manufacture and polymer materials that form a milieu or "matrix" in which conductive structures known as "quantum nanowires" can form. Polymers that are useful include siloxanes and organic polymers that have ionizable moieties that can form organic ions and free electrons. The invention also can include dopants, including alkali metals such as sodium, potassium and the like. The matrix, dopants and ionizable moieties can form nanoscale structures, herein termed "superpolarons" in the matrix, which include solvated electrons. The solvated electrons need not be bound tightly to the molecular ions, and therefore can be moved through the structure with very low electrical resistance at temperatures near room temperature. The resistance to electrical flow can be less than that of conventional metal conductors, and thus, can be characterized as "highly conductive" materials. In fact, electrically conducting structures can have electrical resistance values many orders of magnitude lower than typical of metal conductors.

Quantum nanowires of this invention can provide practical applications in such different fields as microelectronics, opto-electronics, biomedicine, and others, where high performance in conditions of extremely limited space and energy consumption are prime considerations. Additionally, macroscopic applications of the structures of this invention can provide significant improvements of electric motors, power transmission, energy storage, telecommunications, aerospace systems and other devices that can benefit from very low resistance electrical currents.

Thus, in certain embodiments, nanoscale, highly conductive structures can be used to manufacture small semiconductor devices, including transistors, switches, diodes and the like. In certain other embodiments, stable, persistent electrical currents can be produced in circular nanoscale structures. The circular structures can form bases for optical switches, peizoelectric devices, nanoscale sensors, trinary computer devices, and optical detectors.

DETAILED DESCRIPTION OF THE INVENTION

I Polymer Matrices

Polymers used in manufacturing highly conductive materials of this invention can desirably have, in their initial state, certain properties that can promote the formation of superpolarons, defined herein below.

A Molecular and Structural Properties of Polymer Matrices.

The polymers useful for making conductive polymers of this invention include several different chemical classes. Useful polymers include poly(hydrocarbon) molecular chains, poly(siloxanes), poly(urethanes) chain and others. The specific chemical composition of the main part of the polymer matrix is not limiting and can be chosen in accordance with the specific requirements of each particular application. However, it is desirable that useful polymers, in their initial form, should be good dielectrics and, consequently, do not belong to a class of conjugated (or conducting) polymers.

By way of example only, organic polymers can be prepared that comprise macromolecular ions. As used herein, the term "macromolecular" means a molecule having a molecular weight greater than about 2000 atomic mass units ("amu"). Polymer matrices made with macromolecules can have higher viscosity than matrices made with smaller molecular weight materials.

In other embodiments of this invention, small organic molecules can be used as ionizable species. By using low molecular weight materials, the viscosity of the resulting matrix can be lower, that is, more easily flowable.

In other embodiments of this invention, polymers can be selected that include mesogenic groups, providing liquid crystal form, wherein there is some order within an easily flowable matrix. It can be appreciated that combinations of different types of polymeric materials can be used that provide desirable physical and/or chemical properties. Regardless of the physical and/or chemical properties desired, by using molecular ions, dipoles and/or dopants, one can manufacture a polymer material that has quantum nanowires.

Several features of polymers can be defined that can provide physical properties desirable for the formation of conductive polymer structures.

1. It can be desirable that polymer matrices be amorphous or have a low level of overall or bulk crystallinity. When above their glass transition temperature (Tg), amorphic materials can provide an elastic matrix. Glass transition temperature is a function of the chemical design and can be typically selected to be between about −100° C. and about +180° C. At a temperature T>Tg, such polymer matrices permit mobility of elements within the matrix, which is desirable for the self-organization of the conductive structures.

2. Polymers desirably contain an amount of chemical groups having dipole moments. High mobility of these chemical groups, when in an amorphic polymer matrix can provide the groups with the ability to solvate electric charges, and then to stably separate them. This is conceptually similar to the dissolution of a salt, for instance, NaCl in water. The polar water molecules solvate the Na and Cl ions (having positive and negative charges, respectively) separately and thus, the ions become free in solution.

3. Polymers desirably should contain a concentration of specific chemical structures able to lose electrons relatively easily, forming positive molecular ions. The molecular ion can be attached chemically to the polymeric chain and can be stabilized, with a solvating shell formed by the mobile dipole groups in the polymer. Because the whole system remains electrically neutral, the formation of stable positive ions leads to the immediate appearance and solvation of free electrons by the dipole groups. The solvated electron (dipole shell and captured negative charge) is herein termed a "free polaron."

All three components, namely free polarons, stable ions and dipole groups bound with polymer molecular chains actively participate in the subsequent formation of specific quantum mechanical structures called superpolarons.

In certain embodiments of this invention, dopants are added to the polymer matrix. Dopants can include alkali metals such as sodium, potassium and the like. When added to a matrix containing ionizable moieties and dipoles, the metal can dissolve and form a complex with the dipole and ionizable groups. When the ionizing moiety becomes ionized, the metal atoms can assist in stablization of the dipole and molecular ion, thereby forming more stable conductive structures, quantum nanowires. In these embodiments, the metal atoms become part of the structure that is responsible for the electrically conductive properties of the superconducting structure.

B Mechanical and Physical Properties of Polymers

It can be desirable that concentrations of chemical dipole and ionic moieties mentioned above be less than the concentration of monomers in the polymer chain. It can be especially desirable for the concentration of dipole groups to be about 10 to about 100 times less than the concentration of monomers. It can also be especially desirable for the concentration of ionizable groups bo be about 1000 times less than the concentration of monomers in the polymer chain. Providing these relatively low concentrations of dipoles and ionic moieties means dopants introduced into the matrix need not be in a concentrations so high as to alter the desirable physical properties of the polymer matrices.

It can be desirable that the polymer materials be optically transparent over a wide range of wavelengths starting from about 3.2 $\mu$m in the near infrared range to at least about 0.55–0.6 $\mu$m in the visible range. The limit of optical transparency at short wavelengths can depend on the specific chemical composition of a given kind of polymer and may be chosen in accordance with technical requirements. Some desirable materials can have a window of optical transparency up to the far UV region.

In certain embodiments, it can also be desirable for the refractive index to be close to about 1.4–1.5. In certain other embodiments, it can be desirable for polymer matrices to be good electric insulators up to a field intensity in the range of about 0.2 to about 1 MV/cm.

At temperatures above the Tg, matrices of amorphous polymers are in a state herein termed a "high elastic state" ("HES"), which is characterized by a low Young's modulus ("Y") for polymers, herein termed "Ypol" in in the range of about 0.1 to about 10 Kg/cm$^2$. This range is about six orders of magnitude less than the typical Youngs modulus of usual metals ("Ymet") or glasses of about $10^6$ Kg/cm2.

In certain embodiments, it can be desirable for the density of the material to be in the range of about 0.8 to about 1 g/cm$^3$. The combination of high elasticity with a high fractional free volume (about 10% typical for amorphous polymers in HES), the density can easily change up to 10% even at low mechanical stress.

The peculiarity of polymers in HES is that above their Tg, they can combine a high elasticity with an ability to flow as a viscous liquid, so long as the matrix is not cross-linked. This property allows significant macroscopic or local structural reorganization to be controlled by rather low forces. As a result, in the case of internal local tensions caused by Coulomb interactions between separated electric charges inside the polymer matrix, such interactions can become the main driving force for internal self-organization.

That also means that one can, if desired, switch on internal self-organization at any point and/or stop them by means of a simple change of local temperature above or below Tg, or by local cross-linking of the polymer matrix.

II Superpolarons and Quantum Nanowires

Once a polymer material according to Section I above is selected, free polarons, dipole groups and positive ions are randomly distributed in the matrix. A particularly desirable feature is that under certain conditions these elements begin a structural self-organization which can result in the formation of short quantum nanowires (typical lengths of about 0.03 $\mu$m to about 10 $\mu$m and diameters in the range of about 0.003 $\mu$m to about 0.005 $\mu$m) called superpolarons. Superpolarons, depicted schematically in FIG. 1, are fundamental elements of quantum conductive structures. The quantum structures are roughly cylindrical in form and comprise the several components.

First, free polarons in the viscous matrix can move and are able to join each other, gradually forming a thin conducting "electron thread" surrounded by ions and a polarized dipole shell as shown in FIG. 1. The ions and dipole groups participating in the formation of a superpolaron are attached to randomly directed polymer chains, which restrict the mobility of the ions and dipoles. Thus, after self-organization is over, the positions of all ions and dipole groups can become fixed due to the mechanical strength of the matrix, and can be changed only if external forces applied to the whole structure exceed this strength.

Electrons concentrated along the superpolaron's central axis are free and are not limited by polymer molecules. In accordance with quantum mechanical laws, these electrons can move persistently forth and back from one end of a superpolaron to another one. That distinguishes the superpolaron's conducting "thread" from conjugated polymers, where free electrons can carry electric current easily within a molecular chain, but can move from one molecule to another only by "hopping" between the molecular chains.

As depicted in FIG. 1, this elementary superpolaron appears like a miniature cylindrical capacitor where ions form an external positive shell, electrons form an internal negative "thread", and dipole groups (arrows) oriented in radial directions serve as an insulator between positive (+) and negative (−) charges. According to one theory, the formation of such structures is purely quantum mechanical and cannot be understood in simplified classic terms.

Experiments carried out are consistent with quantum theory and have established several electronic and magnetic properties of superpolarons.

1 Electronic Properties

Figure 2:
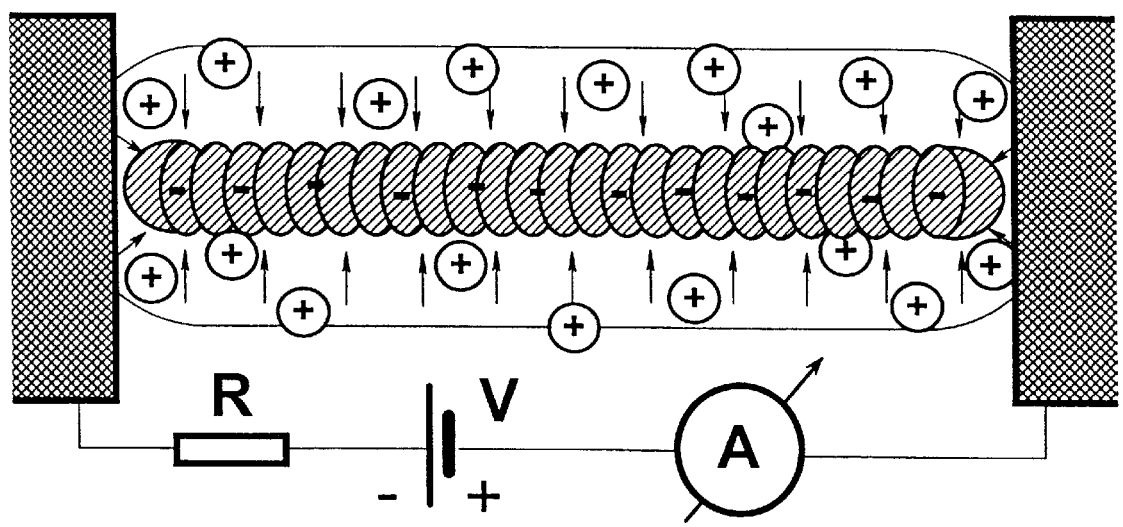
FIG. 2 depicts a superpolaron of this invention in a nanocircuit.
Figure 3:
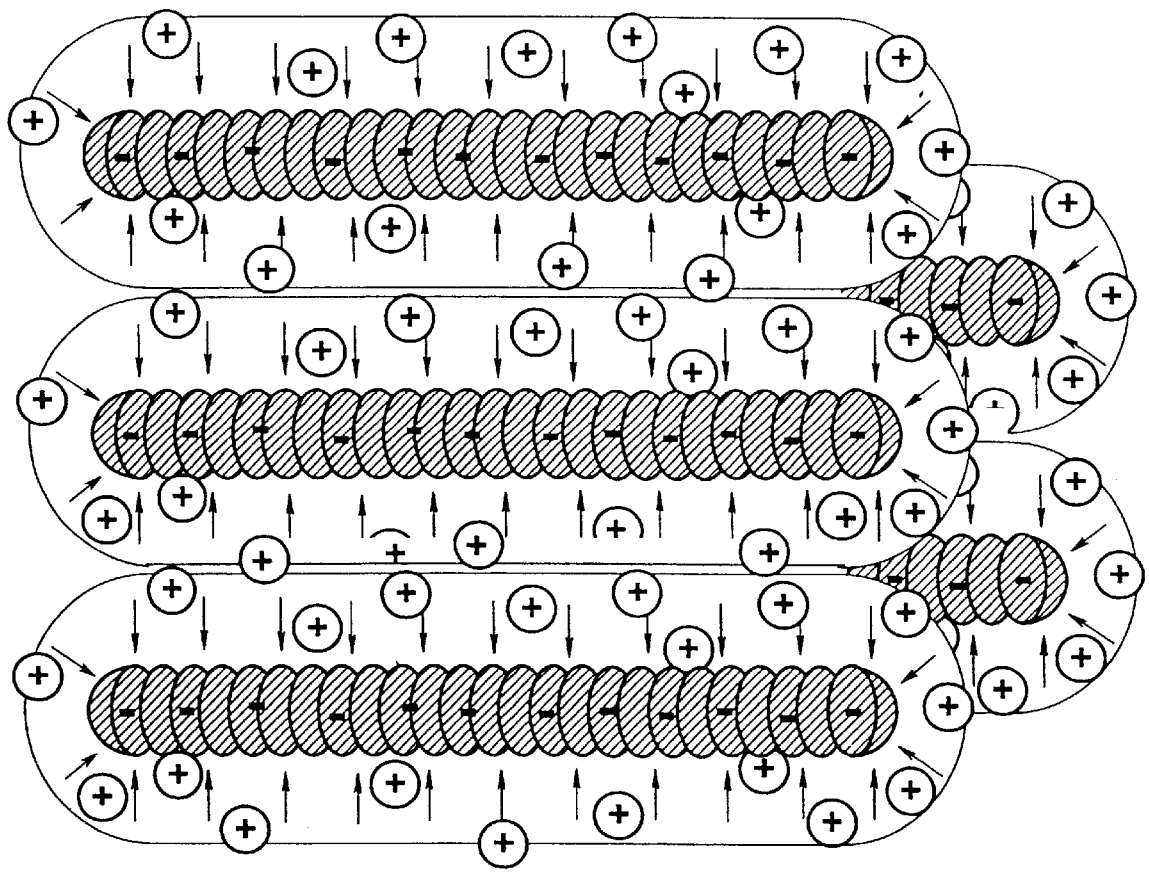
FIG. 3 depicts a bundle of superpolarons of this invention configured as a microwire.

Polymer matrices and superconducting superpolarons of this invention can have desired electronic and magnetic properties. Electrical properties that can be especially desirable include high conductivity that can be relatively independent of the temperature. Thus, in certain embodiments of this invention, the quantum nanowires can be superconductors at near room temperature.

i. A superpolaron's "electron thread" is a perfect conductor of an electric current if metallic electrodes are connected with its ends and some low voltage V is applied (see FIG. 2). FIG. 2 depicts a complete electrical circuit containing a superpolaron, metal contacts (shaded areas), a voltage source (V), a resistor (R) and a current detector (A). Upon application of the voltage, the highest ("critical") current, $J_c$, is estimated to be about 10 μA/thread. For a superpolaron having a diameter of about 3–5 nm, that current corresponds to current carrying capacity close to or above $10^8$ A/cm².

ii. Conducting properties of a superpolaron are found to be temperature independent in wide range of temperatures from about 1 K to about 700 K, and the conductivity of the superpolaron is independent on external magnetic fields up to at least H=90 KGauss (at a temperature of about 4.2 K).

iii. The specific conductivity of a superpolaron measured by different methods at a current $J<J_c$ is technically infinity. For instance, specific conductivity can exceed $10^{11}$ S/cm if it is estimated by electric methods, and at least $10^{21}$ S/cm if specific conductivity is estimated by a magnetic method. Thus, the conductivity of an "electron thread" is at least 5 orders of magnitude higher than that of copper or silver, and in certain embodiments can be 15 orders of magnitude higher.

iv. Increasing the current J above $J_c$ (the "critical" current) causes a rapid (<$10^{-8}$ s) transition to a highly resistive state. Depending on external conditions this transition can be observed in both reversible and irreversible modes.

v. The conductivity of a superpolaron is independent of frequency over a range of frequencies from 0 MHz to about 400 MHz.

vi. Electrons involved in electric conductivity do not contribute practically to heat transfer. In experiments this results in a violation of the Wiedemann-Franz law by at least 7 orders of magnitude.

vii. Infinitely large conductivity of a superpolaron at $J<J_c$ results in zero thermopower. That leads to Seebeck coefficients S of less than about 1 μV/K in wide temperature range.

viii. In the case the "electron thread" contacts with electrodes made of normal metals some contact resistance ("$R_{cont}$") is observed, which is controlled by tunneling of charge carriers between the electron thread and the metal. This results in nonlinearity of current voltage (J-V) characteristics. Changes of properties of the tunneling barrier can cause corresponding transformations of JV curves.

ix. Low temperature experiments have shown that in the case of the contact between an electron thread and superconducting electrodes, the resulting J-V curves exhibit specific peculiarities which are typical for Josephson contact between two superconductors separated by tunneling barrier.

x. During the self-organization process, if they are not separated by a significant distance, superpolarons are able to join with each other to form stable conducting array or bundle (FIG. 3), having diameter about 1–3 μm which is herein termed a "microwire".

2 Magnetic Properties

In addition to the electrical properties described above, the electron threads of this invention can have desirable magnetic properties. Because some of the magnetic properties are associated with structures having superconductivity, in practice, electrical properties can be assessed using observations of magnetic properties of the polymers.

i. Consistent with predictions of the quantum theory, it is experimentally shown that a superpolaron's conducting electrons are in a specific magnetic structure which is termed herein a "ferromagnetic domain." In a ferromagnetic domain, the electrons are arranged so that the electron spins are in the same direction. These domains correspond to very weak or "soft ferromagnets" because their coercive force is less than about 50 Gauss, and in certain embodiments can be close to zero.

ii. During the formation of microwires, the distance between neighboring superpolarons becomes smaller (see FIG. 3) and magnetic interactions between them becomes significant. At this stage a microwire demonstrates the tendency for spontaneous transition from ferromagnetic to antiferromagnetic order. An external magnetic field applied at this intermediate stage can reverse this tendency and cause a transition back to a ferromagnetic state. The field intensity corresponding to such a transition depends on the distance between superpolarons and may vary from a few hundreds Gauss to at least 2 Tesla.

Figure 4:
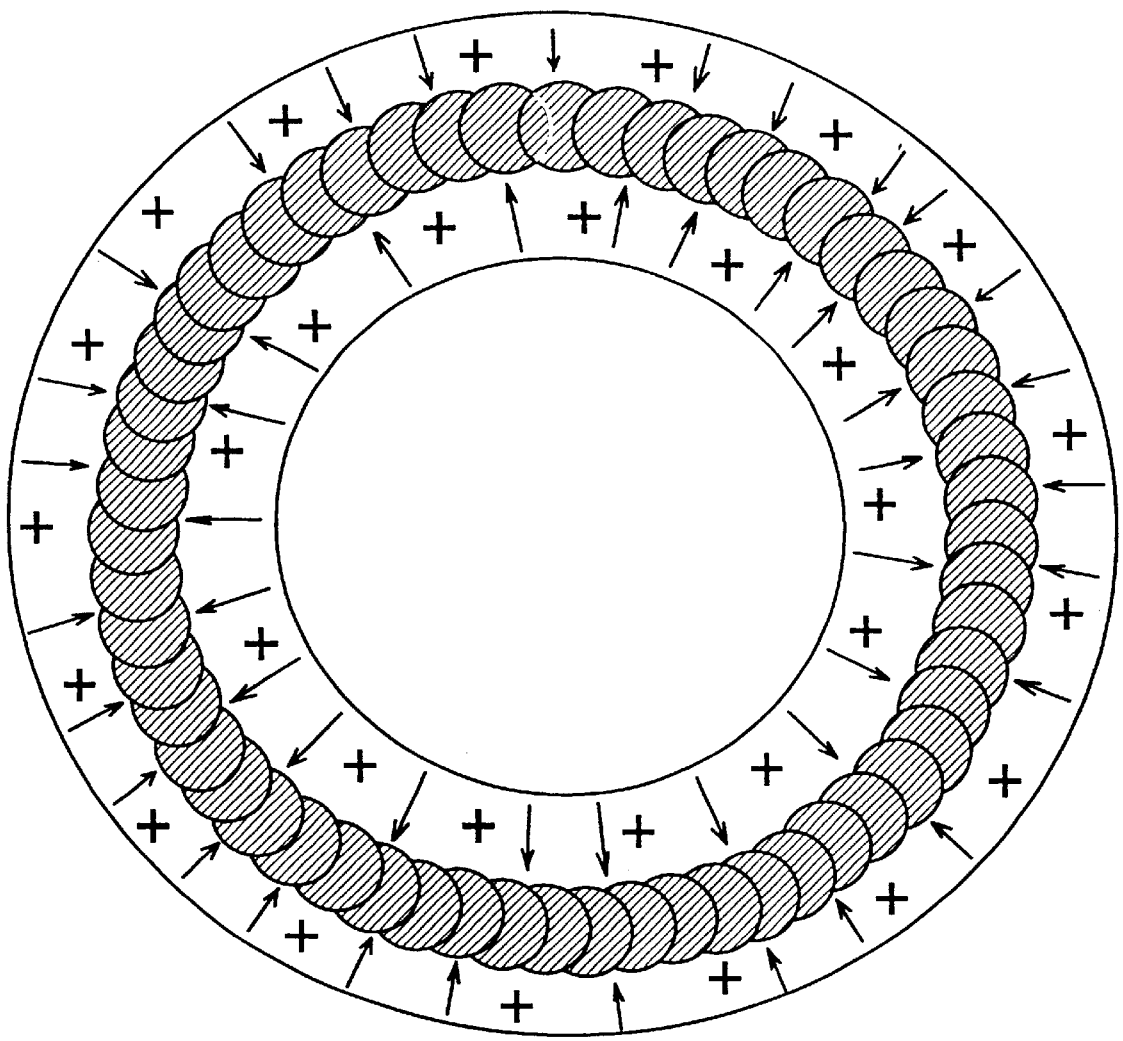
FIG. 4 depicts a circular superpolaron of this invention in the form of a closed conducting loop.

Interesting magnetic properties can appear under certain experimental conditions, when the growing superpolarons form conducting closed loops, as shown in FIG. 4. In such a closed loop, dipoles in the inner portion are oriented radially outwards, whereas dipoles in the outer portion are oriented radially inwards.

Such closed loops can have extremely high conductivity, and therefore can behave as an ideal diamagnetic, preventing any change of magnetic flux in the loop's area. Consequently, the change of external magnetic field can induce a persistent current in such a closed loop, and, in such a case, the loop can become a permanent magnet. The strength of such a magnet is limited only by the size of the loop and by the value of $J_c$. One more peculiarity of closed loop superpolarons is that due to the microscopic size of the loop, its current and magnetic moment can not change gradually and should be quantified by some discrete values.

3 Applications of Superconducting Superpolarons

Superconducting Superpolarons of this invention can have numerous applications. For instance, a parallel array of only $10^{10}$ elements having the length 1 micron each provides a superconducting wire as long as 10 kilometers in length. Such a polymeric wire is self-insulating, has diameter less than or about 10 microns, and can carry current up to 50 Amperes without substantial energetic losses in the temperature range from $-273°$ C. to about $+200°$ C. A remarkable feature is that such a wire can be manufactured from only about 1 cm$^3$ of polymer material, and its weight doesn't exceed 1 gram.

The appearance of electric wire having no resistance at ambient temperature can improve the efficiency and lower the cost to the electric industry. Some of the advantages are described below.

1. The reduction of energetic losses in electric generation, transmission and consumption is equivalent to the saving of millions of barrels of crude oil a year. Commercial and ecological consequences of that are evident and well documented.
2. Giant or distributed energy storage systems (magnetic coils charged with persistent current) may be used in order to avoid peak overloading and night-day-night irregularity in electricity consumption.
3. In power transmission there can be no more need for the transformation of the voltage from low to high and back, because to the absence of resistive losses. Instead of high voltage power lines suspended now in the air low voltage underground lines will be used.
4. This low voltage electricity can be distributed between customers directly, without the use of intermediate transformers.
5. Taking into account point #3 above, instead of alternative high voltage current, new power plants can produce low voltage DC current only, because for power transmission DC current avoids capacitance losses and provides many other technical advantages.
6. Further improvements of today's aging electric infrastructure can be built around superconducting wires, including high efficiency DC motors, power switches, a wide variety of electric appliances, low volume and high capacity magnetic energy storage devices (batteries), different cables for both power transfer and communication systems, and the like.

III Microelectrical Elements Based on Superpolarons

In certain devices, electrical devices can be built from a given combination of two different types of elementary elements: 1) passive two-point elements; 2) active elements which have at least three points. Passive elements comprise conducting superpolarons, metal contacts useful for initiating flow of electrical current, generating magnetic fields, inducing electrical currents in nearby structures, and other, relatively simple elements. Active elements comprise combinations of passive elements that can interact with each other to convert energy from one form to another, for example, piezoelectric devices, optical switches, mechanical sensors, and logic devices.

A Passive Elements

Figure 5:
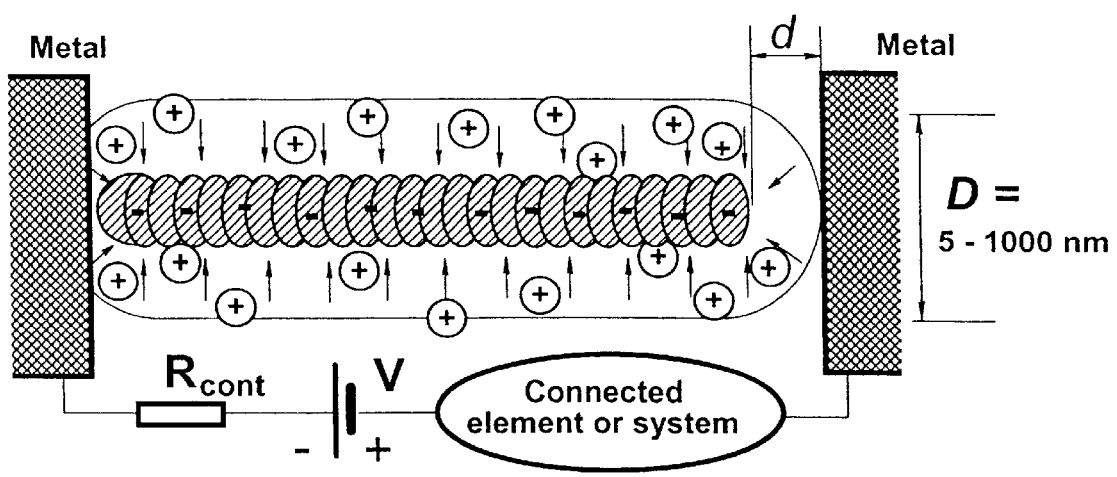
FIG. 5 depicts a superpolaron of this invention in a circuit containing a connected element or system. Gap d represents a dielectric gap between the superpolaron and a metal contact (shaded elements).

Passive elements of the first group use designs, including those depicted in FIG. 5. FIG. 5 depicts a superpolaron having positive (+) and negative (−) charges, dipoles (arrows), metal contacts (shaded areas), a voltage source (V), a resistor including contact resistance ($R_{cont}$) and a connected element or system (shown in ellipse). A single superpolaron (or alternatively, a microwire) is placed between two metal electrodes, with a dielectric gap d between the end of a superpolaron and one electrode. The width of the superpolaron or microwire (D) is between about 5 nm to about 1 $\mu$m.

In the case of electrodes made of normal metal, the contact resistance $R_{cont}$ shown in FIG. 5 is always present and depends on metal specific resistance Pm, the contact diameter D, and dielectric coefficient $\beta(d)$ dependent on the gap (d) which reflects the efficiency of tunneling through the gap. Electrodes made of any normal metal provide always two major components of contact resistance $R_{cont}$ of a contact area having diameter D. The first component is localized directly in the adjacent conic space of a metal. The first component depends only on metal specific resistance $P_m$ and reciprocal of the contact diameter D, and may be approximated as follows $$R_1 = \frac{\rho_m}{D}.$$

The second component applies to any normal metal. The electron flow related to a given area and a given narrow energy band is limited in accordance with Fermi distribution. This component can be estimated from the known density of electron states near Fermi energy $E_F$ $$\frac{dn}{dE} = 2 \frac{8m}{\pi^2 h^3} \sqrt{2mE}$$

where first coefficient 2 is due to both electron spin directions are taken into account. If current flows through a diaphragm having area $\pi D^2/4$ and a small voltage V is applied across that diaphragm, then only those electrons can cross the diaphragm area whose energies are concentrated in a narrow band eV near $E_F$ with average velocity $v_F{}^{/2}=$ $$\sqrt{E_F/2m}$$

wherein averaging should be taken over all angles in $\pi$ steradian. That results in a current flow and diaphragm resistance $R_{dia}$ can be expressed as $$R_{dia} = \frac{V}{J} = \frac{\pi h^3}{2e^2 m E_F} \frac{1}{D^2}$$

If tunneling through the diaphragm is involved and its active part is narrowed $\beta(d)<1$ times due to low tunneling probability, some part of the current flow is reflected and the resistance increases. Therefore, the final expression, taking into account both components, can be expressed as:

$$R_{cont} = R_1 + R_2 = \frac{\rho_m}{D} + \frac{\pi h^3}{2e^2 m E_F} \frac{1}{D^2 \beta(d)}$$

For practical aims, this formula can be simplified to:

$$R_{cont} = R_1 + R_2 \cong \frac{\rho_m}{D} + \frac{3 \cdot 10^{-12} \text{ Ohm} \cdot \text{cm}^2}{2D^2 \beta(d)}$$

Therefore, the second term becomes important or even dominating at very small contact diameters where D<<100 nm, or in the case of a very low tunneling probability where $\beta(d)<<1$.

In the case where the conductivity of an element is controlled by tunneling through the gap, conductivity depends mainly on the value of d. Several different elements can be made to take advantage of this situation.

1 Elements Having Distance d Less than About 0.1 nm

In situations in which the gap d is less than about 0.1 nm, such an element may be used as simple nanowire for use as electric connectors for power or signal transmission. With d being low, the resistance $R_{cont}$ is very close to zero. Current-voltage curves of such elements are linear ones with good precision. The diameter of such a nanowire can be as small as 5 nm, and can carry low power signals with current of less than about 10 $\mu$A. Increasing the diameter to about 5 $\mu$m can provide for higher current pulses up to about 20 to about 30 A.

The same element may be used as an irreversible current limiter or "fuse" to protect against destructive currents above about 4 to about 50 A. The transition time of such a limiter does not exceed about $10^{-8}$ s.

2 Elements Having Distance d in the Range of About 0.5 nm to About 1 nm

Figure 6:
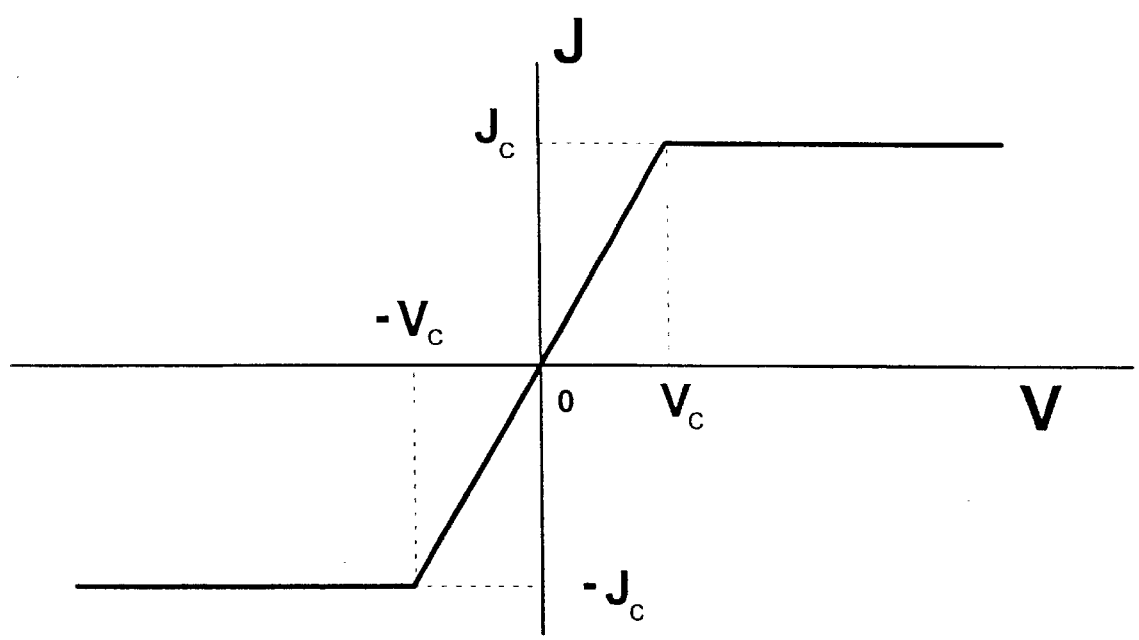
FIG. 6 depicts a voltage/current (J/V) curve typical of a circuit as depicted in FIG. 5 having a gap dimension in the range of about 1 nm.

An element having gap dimension between about 0.5 nm and about 1 nm can be used as a combination of a nanowire carrying middle power DC or AC current, J of about 10 mA with a reversible current limiter to protect the circuitry against currents that are too high above $J_c$. FIG. 6 depicts the relationships between the voltage V and the current J for nanowires having gaps d in the range of about 0.5 nm to about 1 nm. The dimensions of d and D determine the slope of the linear part of the curve shown in FIG. 6 in the range of voltages between $-V_c$ and $V_c$. This relationship allows such elements to be used as variable resistors in the range 1–10,000 Ohms.

Additionally, taking into account the sharp break of the J-V curve at $V_c$, the same elements can be used as current stabilizers.

3 Elements Having Distance d in the Range of About 1.5 to About 2 nm

Figure 7:
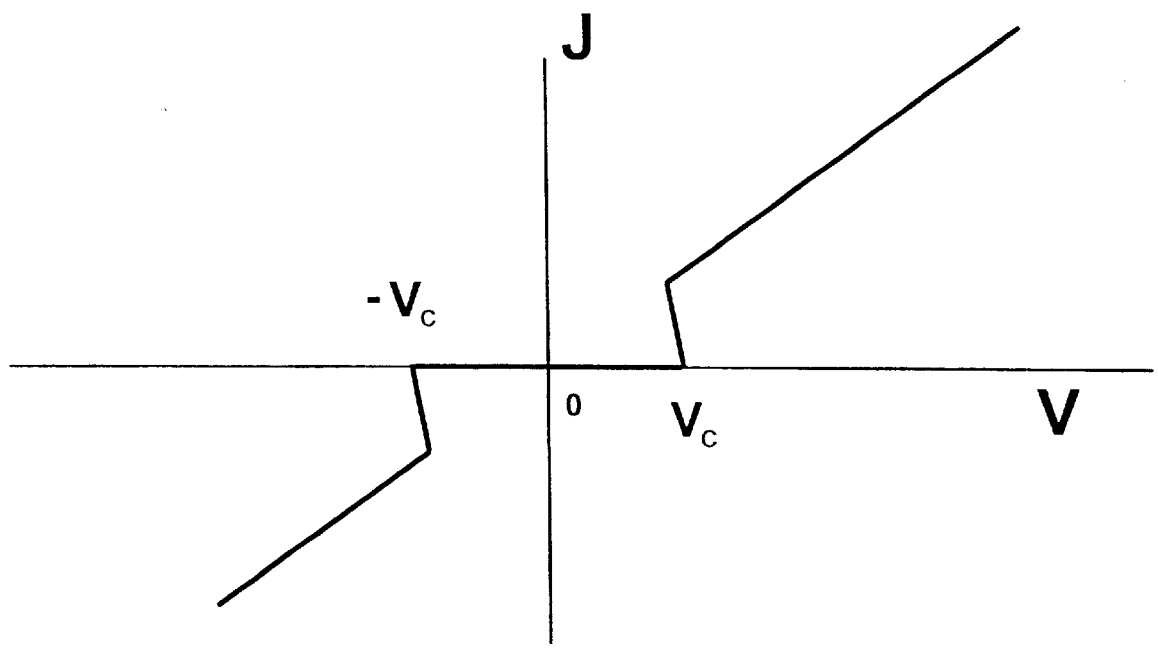
FIG. 7 depicts a voltage/current (J/V) curve typical of a circuit as depicted in FIG. 5 having a gap dimension in the range of about 1.5–2 nm.

In the range of d between about 1.5 nm to about 2 nm, the tunneling coefficient becomes so small $\beta(d)<<1$ that J-V characteristics have a substantially different character, shown in FIG. 7, from those illustrated in FIG. 6 above. For this type of element, the linear part of the J-V curve corresponds to relatively high resistance.

FIG. 7 depicts the current voltage relationships for a passive element having d between about 1.5 nm and about 2 nm. At voltages below -Vc and above Vc, there is a linear relationship between applied voltage V and the resulting current J. However, at voltages slightly higher than -Vc, there is an abrupt change in current, with the current decreasing as V returns to Vc. From -Vc to Vc, current does not flow, but at Vc, current increases, and as V increases further, current increases in a linear fashion.

Consequently, elements having this J-V relationship can be used for low power signals transfer enhanced by the several advantages. The elements having this type of J-V relationship can be used in microelectronics as low power nanowires or non-linear resistors having high resistance above about 10,000 Ohms combined with a low voltage noise suppresser or signal discriminator.

An additional property of this kind of element is due to a combination of relatively high voltage range 0.3–6 V with the specificity of resistive nature which appears during electron tunneling through the gap d. Taking into account the character of the electron spectrum in metals, the voltage drop V may cause, instead of heat generation, the emission of light quanta in a wide spectral range from near IR up to far UV-wavelength.

This feature means these elements can be used as nanoscale broad spectrum opto-electronic transformers of electric signals to light. Due to the reversibility of these processes on the microscopic level, the same elements may serve as opto-electronic receivers and transfer the light to electric signals.

4 Monochromatic Opto-electronic Transformers

In contrast with previous element No 3 above, based on superpolaron-metal contact and providing non selective opto-electric transformations "signal-to-light" and "light-to-signal" in wide wavelength range, a slightly different element can be based on properties of superpolaron-superpolaron tunnel contact (FIG. 8) which possess a high selectivity of opto-electronic transformation.

Figure 8:
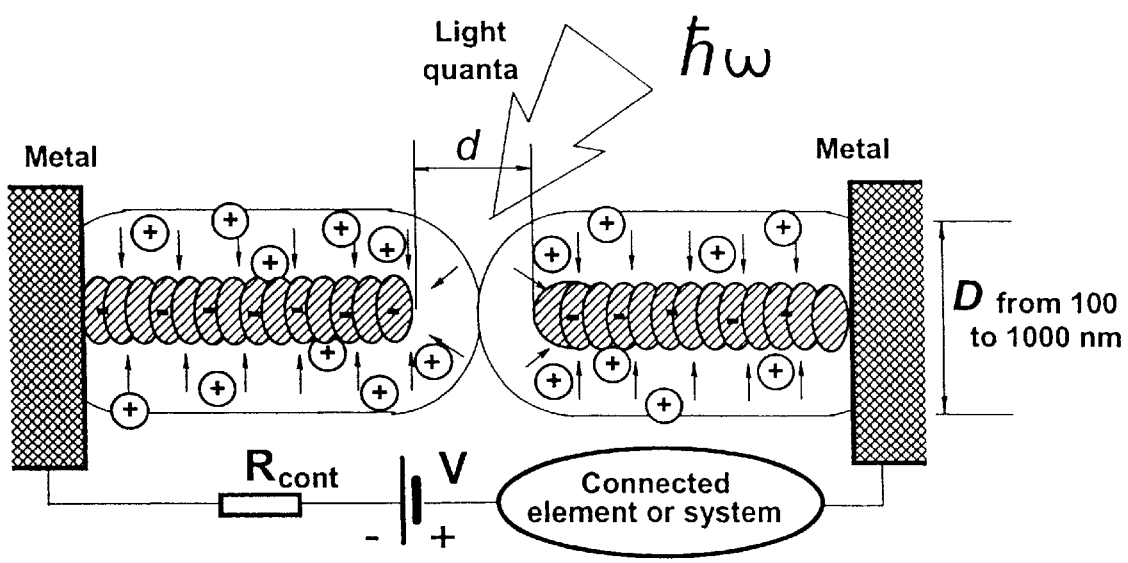
FIG. 8 depicts an opto-electronic transformer of this invention comprising two superpolarons and depicting an incident electromagnetic photon hω.

FIG. 8 depicts an adjustable opto-electronic transformer operating with monochromatic quanta in a wide range of wavelengths. Two superpolarons are aligned coaxially to form a double superpolaron, with metal contacts (shaded areas) at opposite ends of the double superpolaron. The gap d is twice the gap for a single superpolaron, and light quantum hw is shown impinging on the gap. The idea is based on the quantum peculiarity of superpolarons in which all free electrons are paired and condensed on the same energetic level, a feature consistent with both theoretical predictions and experimental results.

Figure 9:
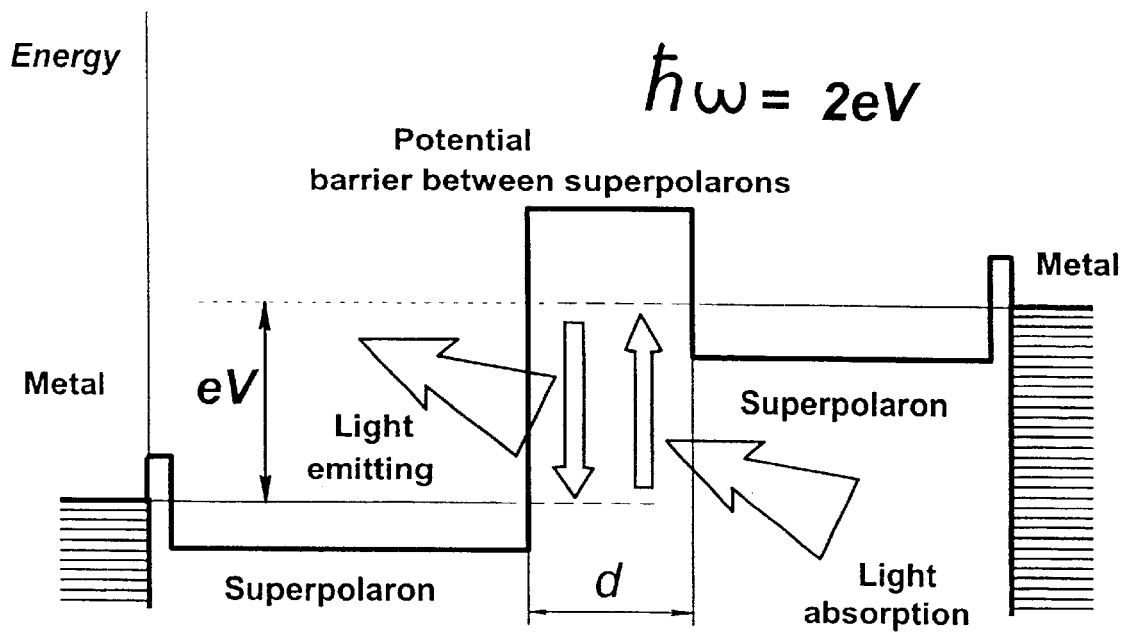
FIG. 9 depicts an energetic diagram of the opto-electronic transformer of this invention as depicted in FIG. 8.

If an external voltage V is applied to the system in FIG. 8 containing tunnel contact of two superpolarons, light absorption and emission is illustrated by the energetic diagram depicted in FIG. 9. FIG. 9 depicts a process of generation of an electric signal due to the absorption of a quantum of light, or the conversion of the electrical energy applied to the double superpolaron into a quantum of emitted light. The metal contacts have an applied voltage eV between them. An incident quantum ("light absorption") raises the energy level between superpolarons. An emitted quantum ("light emitting") has an energy that depends upon the voltage V, which has a non-zero value due to the potential energy barrier between the superpolarons.

From a quantum mechanical viewpoint such a system is similar to the well known Josephson contact ("JC") which at $$V_o = \frac{\Delta}{e},$$

where $\Delta$ is the energetic gap in the spectrum of conventional low temperature materials thought to be superconductors. Such Josephson contacts can emit coherent radio waves with specific frequency ($\omega$) $\omega=2$ eV/h, wherein h is Planck's constant. This process may be reversed and quanta are absorbed if the same frequency radio wave falls on the contact. In such case the strong change of J-V curve appears in the form of so-called Fiske or Shapiro steps, wherein the relationship between V and J is characterized by stepwose increases in J as V is increased.

Thus, the physical nature and behavior of conventional JC and the system shown in FIG. 8 can be similar. At the same time there is a significant difference between them. Conventional JC systems may cover only the non optical band of microwaves, and only operates at very low temperatures (e.g., liquid helium), while the superpolaron elements of this invention can cover the whole optical range of wavelengths and can operate at ambient temperature (i.e., room temperature).

The element depicted in FIGS. 8 and 9 can be electronically adjusted in nanoseconds for any monochromatic quanta having wavelength from near IR to far UV by changing the applied voltage V in the range of about 0.1 V to below about 10 V. Alternatively, the V can be in the range of about 0.2 V to about 5 V, and in yet other embodiments, can be in the range of about 0.3 V to about 3 V. With smaller voltages, the wavelength of light is longer, and with higher voltages, the wavelength of light is shorter. A voltage of 3 V can create quanta of about 6 eV, which corresponds to a wavelength of about 200 nm in the far ultraviolet range.

Passive elements such as those listed above can work at any polarity of both information signals (i.e., electromagnetic radiation) and voltage of a power supply in the range of few volts.

The capability of such passive elements to work at high frequencies can depend on both typical resistance R, described above, and its capacitance C which can be easily estimated. For instance, at tunneling gap d about 1 nm such an estimation does not exceed a capacitance C of about $10^{-14}$ Farad ("F") in the case of high power elements with a dimension D of about 1000 nm, having a resistance R of about $10^4$ Ohms. For such elements, the typical time-constant RC is about $10^{-10}$ s, which corresponds to a basic frequency of about 2 GigaHz.

In the case of low power elements, having dimension D of about 10 nm and resistance up to about $10^7$ Ohms, corresponding estimations of C and RC are about $10^{-18}$ F and about $10^{-11}$ s, respectively, which corresponds to a basic frequency of about 20 GigaHz and can be increased further, up to 200 GigaHz, by decreasing the resistance to about $10^6$ Ohms. The speed be further increased by further decreasing R. A limit of the basic frequency can be near ω of about $10^{15}$ s$^{-1}$, where the wavelength of the electric signal approximates the size of a superpolaron.

5 Inductive and Long-Term Memory Electromagnetic Elements

The above sections 1–4 described elements whose properties are based on purely electrical features of superpolarons. In this section we consider some embodiments incorporating electromagnetic features. The first element can have high inductance, and can be built with the use of a nanowire described above and situated relatively near to a superpolaron in the form of closed loop (FIG. 10).

Figure 10:
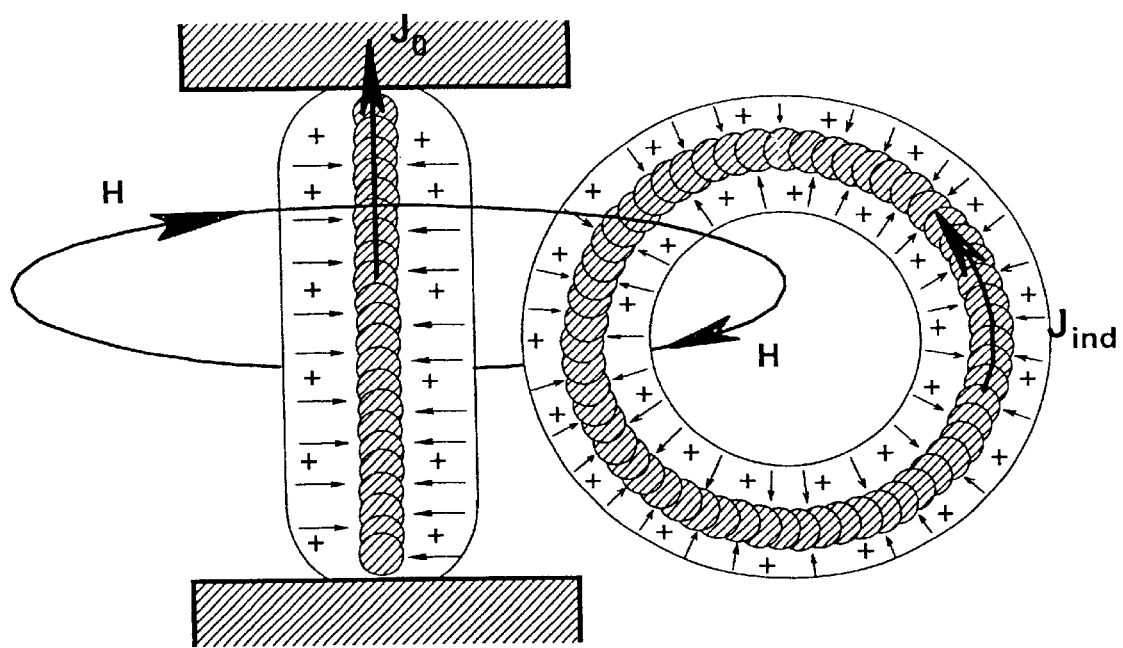
FIG. 10 depicts a high inductance element of this invention comprising a linear superpolaron with an electronic current flowing therein, and a circular superpolaron with an electric current induced therein by a magnetic field induced by the current in the linear superpolaron.

FIG. 10 depicts a high inductance element of the present invention. The left hand element is a linear superpolaron as described above having two metal contacts (shaded areas). A voltage is applied between the metal contacts, thereby producing current Jo. The current through the superpolaron generates a magnetic field(H) around the superpolaron. The element on the right is a circular superpolaron. Both linear and circular superpolarons are magnetically bound because a time-dependent magnetic field H created at time t by linear current $J_0(t)$ crosses the area of the closed loop and induces circular current $J_{ind}(t)$. Such a system can accumulate significant energy in the magnetic field of the circular superpolaron, and its inductance becomes much higher than that of a single nanowire.

Such an element as depicted in FIG. 10 having increased inductance can be used for the formation of electric signals delayed in time, creating high frequency generators, and any other applications known in microelectronic circuitry where high inductance is useful.

Some specific quantum mechanical differences exist between the behavior of traditional inducers and nanoinducers as depicted in FIG. 10. The persistent current $J_{ind}(t)$ in the closed loop can be related to the number of magnetic flux quanta $n_0$ penetrating through the loop area. The dependence of $J_{ind}$ on the magnetic flux is depicted in FIG. 11.

Figure 11:
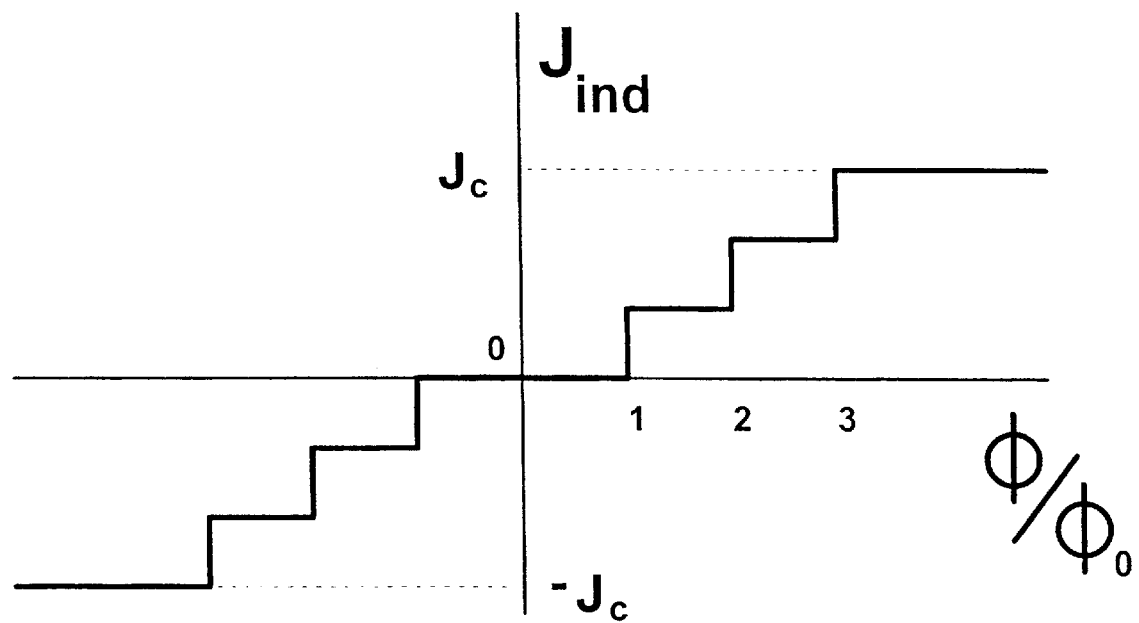
FIG. 11 depicts the relationship between magnetic flux quanta and an induced current in a superpolaron of a high inductance element as depicted in FIG. 10.

FIG. 11 depicts the relationship between magnetic quanta φ, expressed as a ratio $\phi/\phi_o$ of the magnetic quanta under a given condition (φ) divided by the number of magnetic quanta at a baseline state ($\phi_0$) and the current induced (Jind) in circular superpolaron. As the number of magnetic quanta increases, Jind increases in proportion. Also depicted in FIG. 11 are the critical currents –Jc and Jc, above which further increases in the numbers of magnetic quanta do not result in increased induced current flows.

Figure 12A:
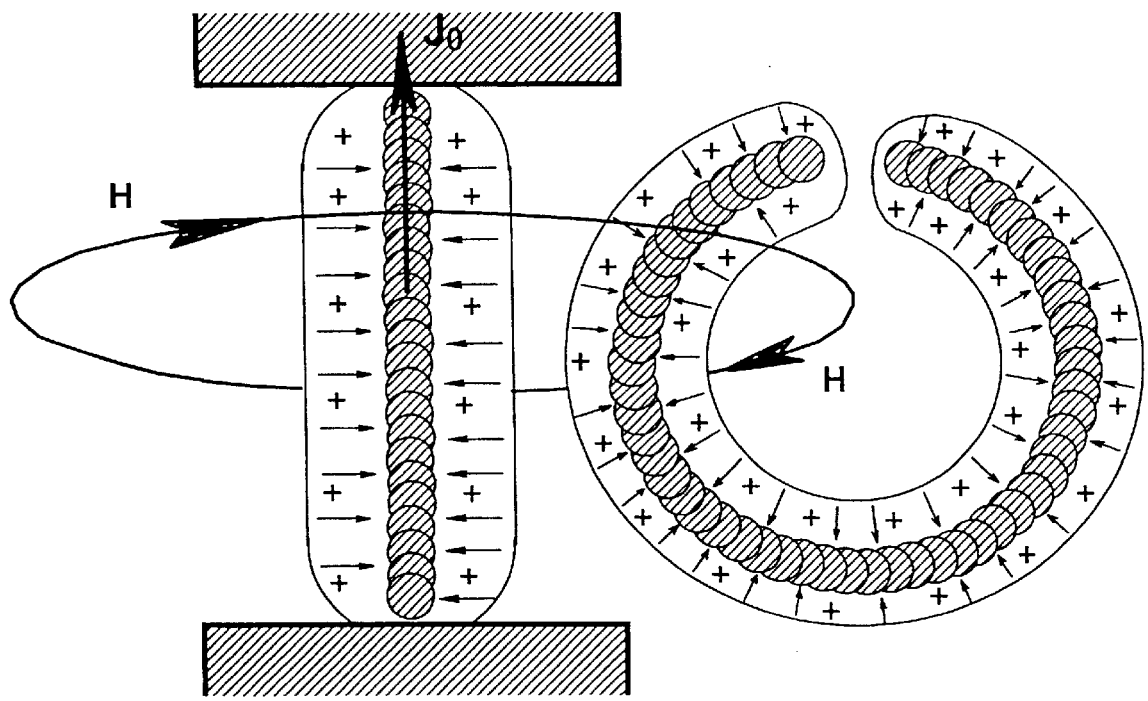
FIGS. 12a–12b depict steps in the creation of a persistent electrical current in a circular superpolaron of this invention.

The inductive elements described above permit the manufacture of long-term memory elements ("LTME") (FIG. 12). Long term memory elements are based on the ability of a superconducting circular superpolaron to maintain an induced current for a long time. In one type of embodiment, the LTME comprises an element as depicted in FIG. 10 but before completion of the circular superpolaron (FIG. 12a). In order to write the logic state "1" to the LTME, the following steps are used: 1) a DC magnetic field is created in the left element by linear current $J_0 \neq 0$, but the circular superpolaron is not finally formed yet, so there is no induced current; 2) In the presence of a constant magnetic field the formation of a closed loop is then completed (not shown); 3) Persistent current $J_{ind} \neq 0$ is induced in the loop by changes in the magnetic field, dH/dt≠0 while switching off the writing current $J_0$. Same steps taken at $J_0 = 0$ result in zero induced current which means logic "0." Note that Jind is depicted in the reverse direction from than of FIG. 10. This is because Jind is induced by the collapse of the magnetic field surrounding the linear superpolaron.

Due to the persistent character of the current in the closed loop, the information written in it is saved independently of whether a linear current is excited again or the power supply is off.

Figure 12B:
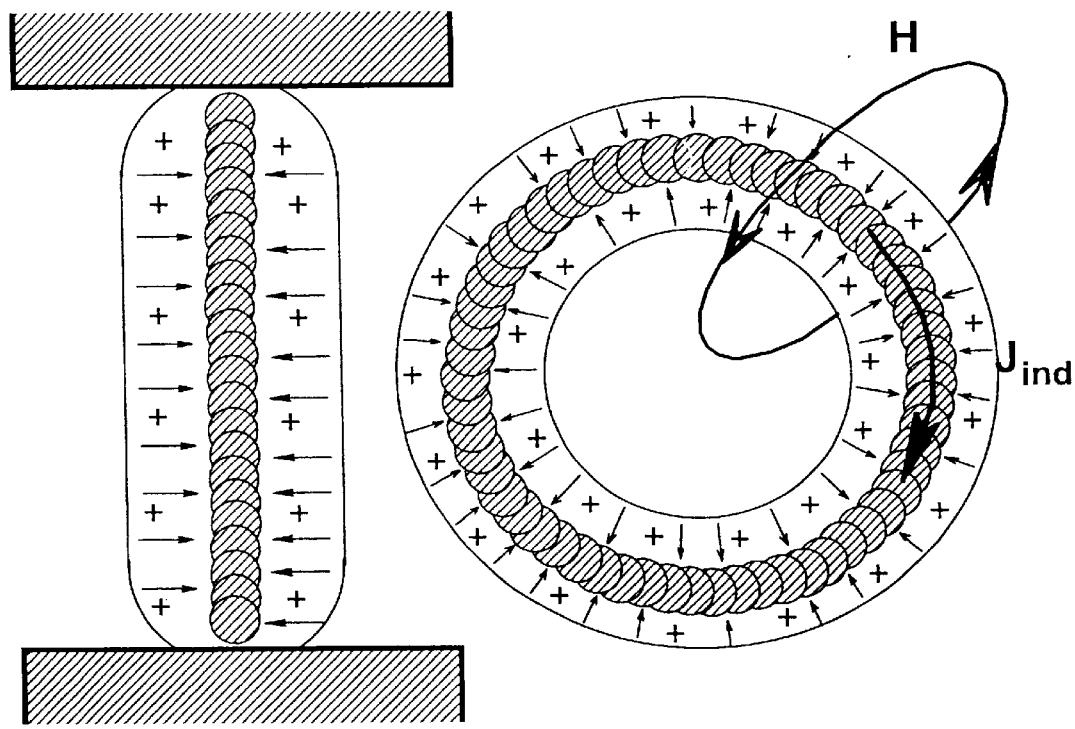

The logic state of the final structure depicted in FIG. 12b can be read by the application of linear current $J_0$ through the linear superpolaron. The induced current in the device having logic state "1" is its maximal value $J_c$, whereas the induced current in the device having logic state "0" corresponds to the zero point on the diagram depicted in FIG. 11. The logic state "0" is equal to the state of high inductance element producing some delay (or phase shift) between current $J_0$ and voltage applied. In contrast, for logic state "1," the induced current in the loop has a maximal value already, and consequently, the application of current ($J_o$) in the linear superpolaron does not change $J_{ind}$ further. That means the inductance of the element in logic state "1" is as low as that of a simple nanowire and no delay is produced. This provides a simple way to distinguish electronically between two different logic states of LTME.

The characteristic size of one LTME is limited only by the diameter of the circular superpolaron, which can be in the range of about 500 nm to about 1000 nm. Using known values of magnetic flux quanta $\Phi_0 2 \cdot 10^{-7}$ cm$^2$Gauss, the necessary writing-reading current J0 is about 1 mA to about 10 mA, which is suitable for the element #2 described above, and is enough to create local magnetic fields in the range of about 200 Gauss to about 2000 Gauss.

B Active Elements

In contrast with passive elements, whose characteristics are technologically fixed and can not be changed in time, active elements are much more flexible; they can have at least two (and, in certain embodiments even more) different discrete states that can be chosen and changed in time in accordance with the use of external electric or magnetic signals. Such embodiments are possible because of the ability of electrons, flowing coherently within nanowires, to change their quantum mechanical behavior and to jump from one discrete state to another one if their environment, depending on external electric or magnetic field, changes in time.

Below are some examples of active elements for illustration only.

1 Field Controlled Switch

Figure 13:
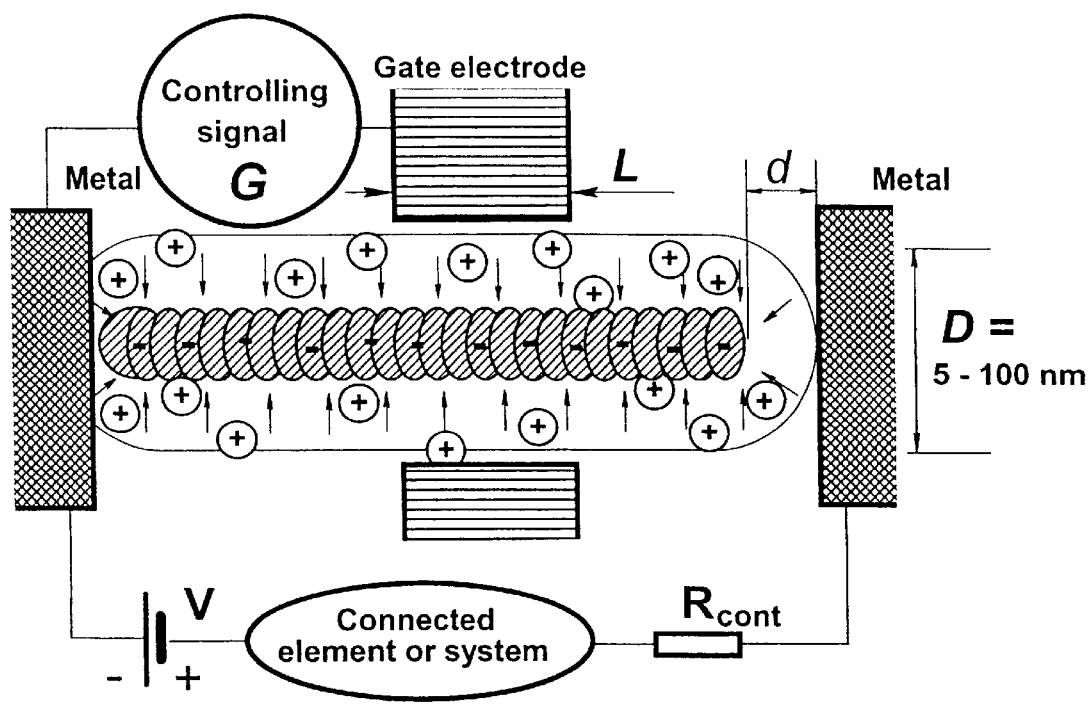
FIG. 13 depicts a field controlled switch of this invention comprising a superpolaron nanowire and a gate electrode.

In this type of embodiment, an active element can be created on the basis of a current carrying nanowire if an additional gate electrode is situated near a superpolaron, but without direct electric contact with it. FIG. 13 depicts a field controlled switch of this invention comprising a superpolaron, metal contacts (shaded areas), voltage source $V_0$, a connected element or system (in ellipse), and resistance Rc. Additionally, a gate electrode having width L and a gate controlling signal G are shown. It can be desirable for width L of this electrode to be greater than the gap d. For instance, d can be in the range of about 0.1 nm to about 2 nm and L can be about 100 nm.

The function of such a field controlled switch is depicted in FIG. 14. A negative gate controlling voltage G, applied to the gate electrode, creates a local change in the potential difference within the nanowire ("bump"). The local bump can influence electron behavior depending on the bump's height. Due to quantum nature of electron movement in the nanowire, two different situations can exist, with a discrete transition between them:

a. Gate Voltage Below $G_0$

Figure 14A:
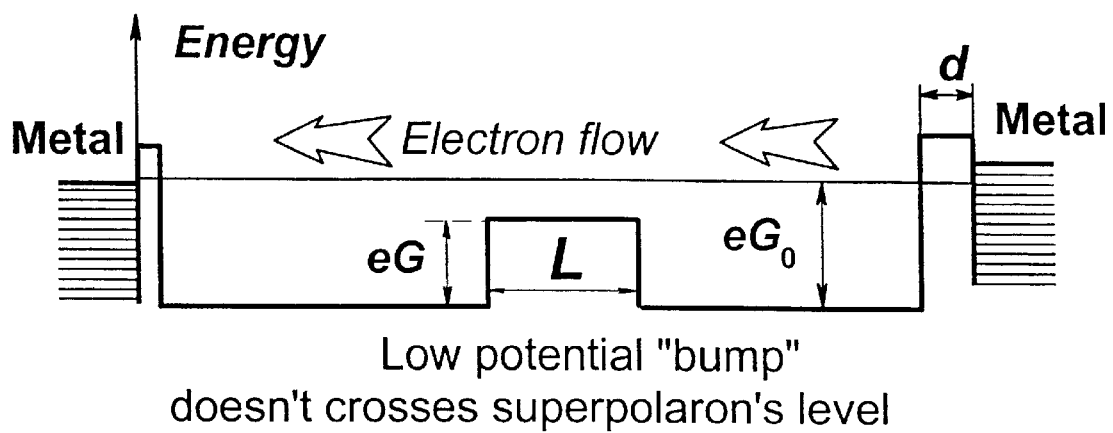
FIGS. 14a and 14b depict two states of the field controlled switch depicted in FIG. 13.

In this situation, the potential "bump" lies below the only level where superpolaron's charge carriers are condensed (FIG. 14a). In this regime, the switch's conductivity is controlled by gap dimension d only and doesn't depend on gate voltage G until electrons can go over potential barrier.

b. Gate Voltage Above $G_0$

Figure 14B:
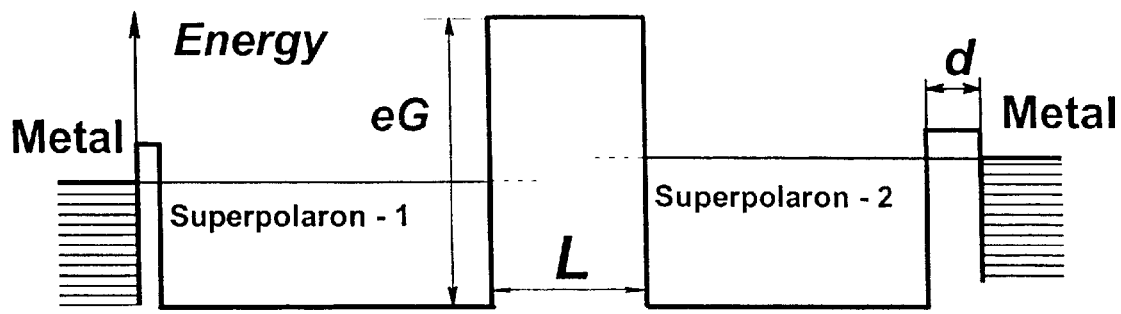

In this situation, the potential barrier exceeds the charge carrier level (FIG. 14b). In this case the electron flow stops because even the slow tunneling through such a barrier becomes unlikely due to the width L. In this state, the electron nanowire becomes broken and two more short, electronically independent, superpolarons appear instead of one long initial superpolaron. The transition back to conducting state a above can occur if the gate voltage returns to below G0.

Such a nanoswitch resembles the well known field transistor used in contemporary semiconductor microelectronics. Nanoswitches and field transistors can be made using this type of element, and can have dimensions as small as about 100 nm.

Figure 15:
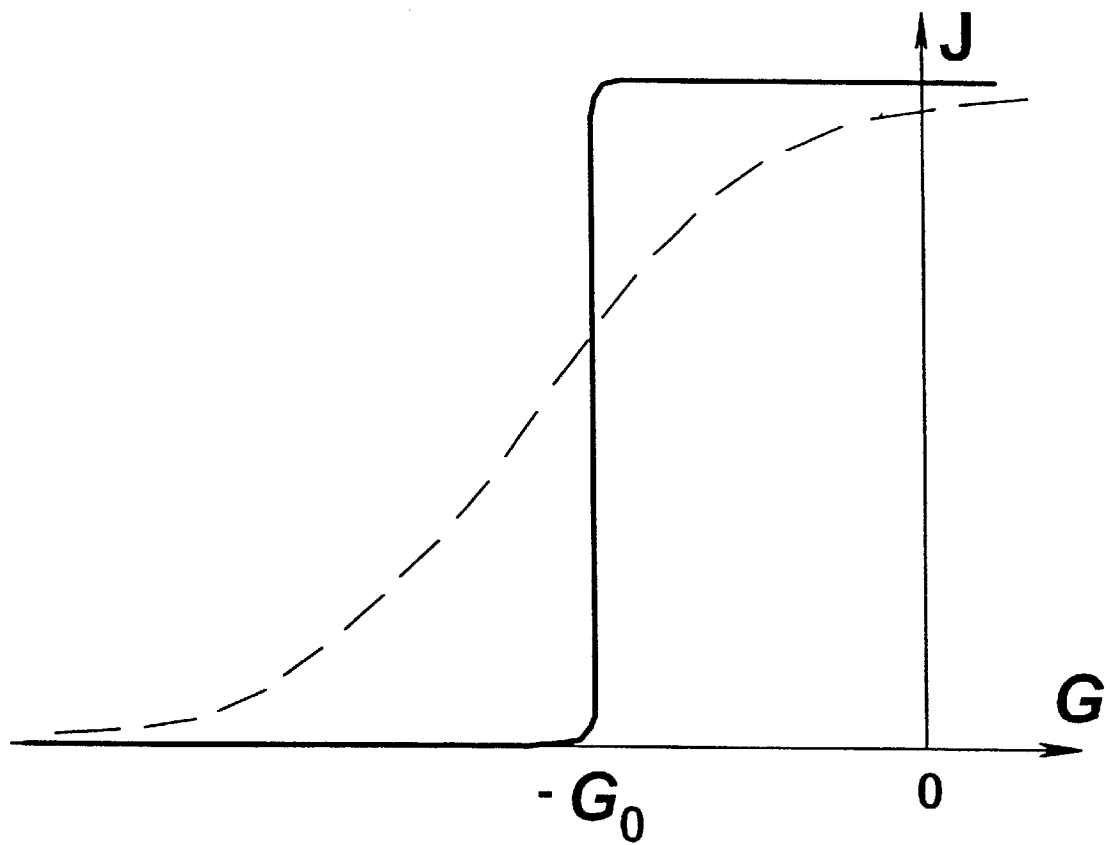
FIG. 15 depicts the relationship between a gate signal and output current through a field controlled switch of this invention as depicted in FIG. 13.

There are some significant differences in function between conventional and field effect switches of this invention. Non-coherent electron movement in the conventional field transistor results in a rather smooth transition between its open and closed states (dashed curve in FIG. 15), but the switch based on quantum features of a nanowire demonstrates at least 100 times sharper transition (solid curve in FIG. 15). In FIG. 15, for a nanoswitch of this invention (solid curve) the gate controlling voltage G less than −G0 produces no current J. However, as the gate voltage reaches −G0, the current J increases abruptly with voltage. In contrast, conventional field effect transistors (dashed curve) have a much broader range of voltages over which current flux changes. The result is that the nanoswitch of this invention, when used in logic circuitry, can consume at least about 100 times less energy during a transition, and can act at least about 100 times faster than usual field transistor.

2 Electromagnetic Rapid Random Access Memory Device

The ability of a. gate electrode to stop electron flow in nanowires when the gate controlling voltage $G>G_0$, and to restore it immediately when $G<G_0$, permits manufacture of an electromagnetic element for a random access memory (RAM) which combines some properties of long-term memory element with an ability to rewrite this information as desired. Because electrical currents in circular superpolarons can be persistent, energy consumption is minimized while maintaining written information for a long time.

By way of example only, such an element is similar to a high inductance element depicted in FIG. 10. One funcitional difference between them is the presence of gate electrodes G1 near linear superpolaron and G2 near the circular superpolaron. All necessary features of such a RAM element appear as a result of setting the electrical potentials of these both gates.

Figure 16A:
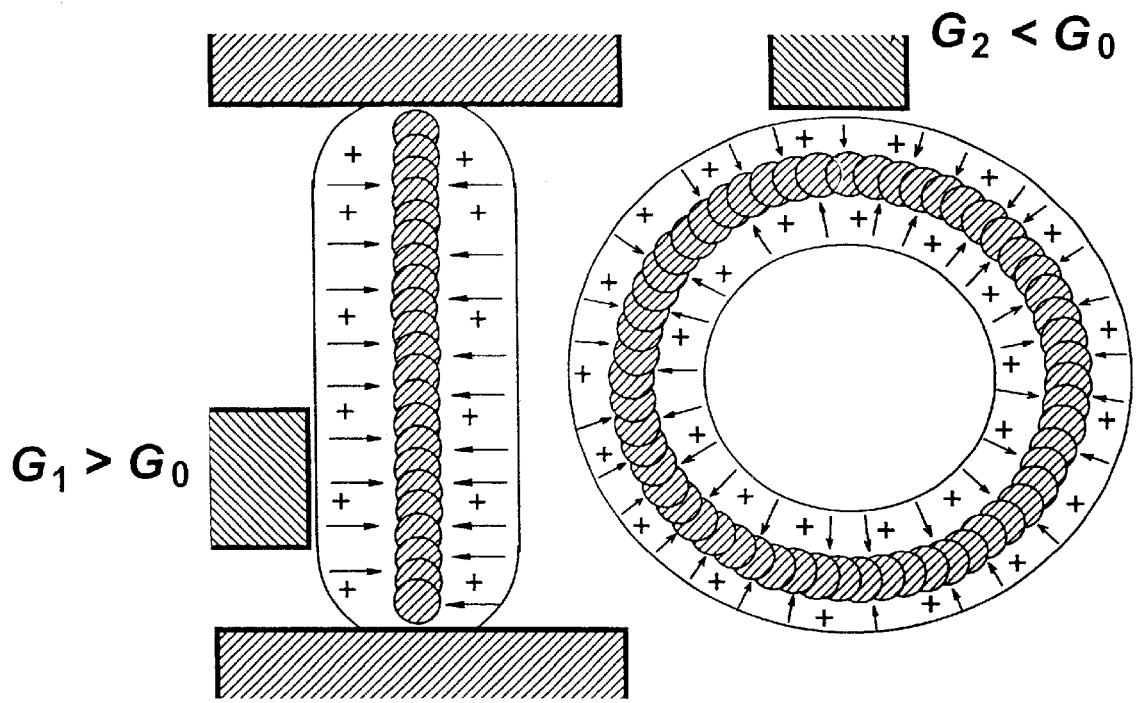
FIGS. 16a–16d depict steps in creating a logic state in an electromagnetic element of a random access memory (RAM) of this invention.
Figure 16B:
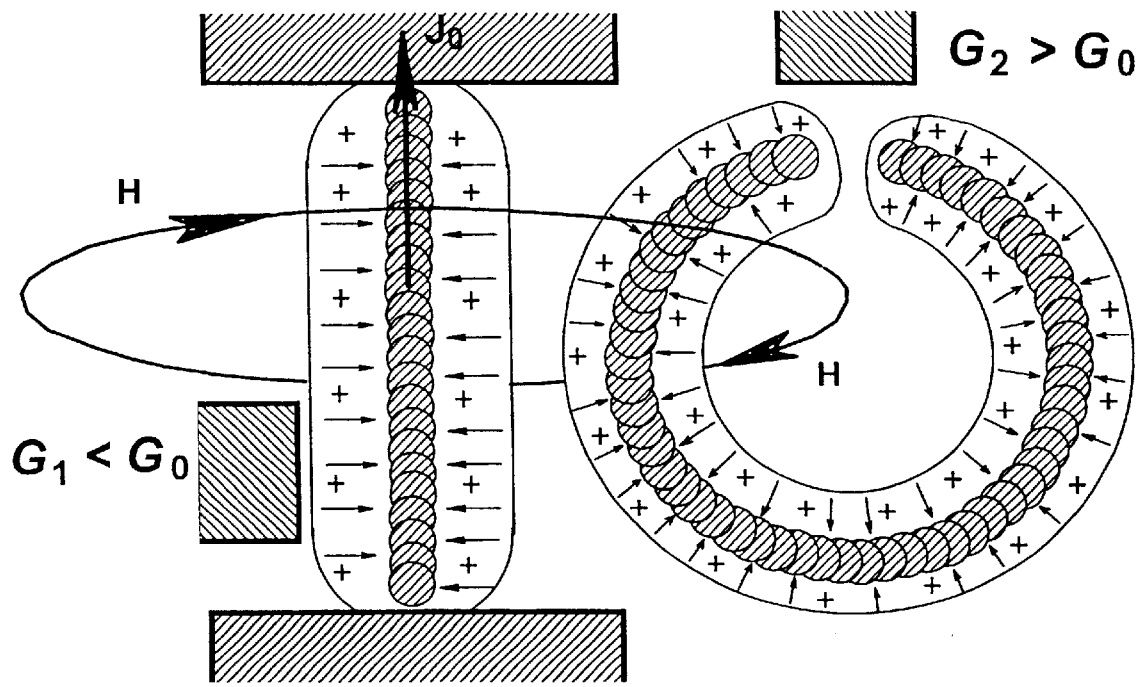
Figure 16C:
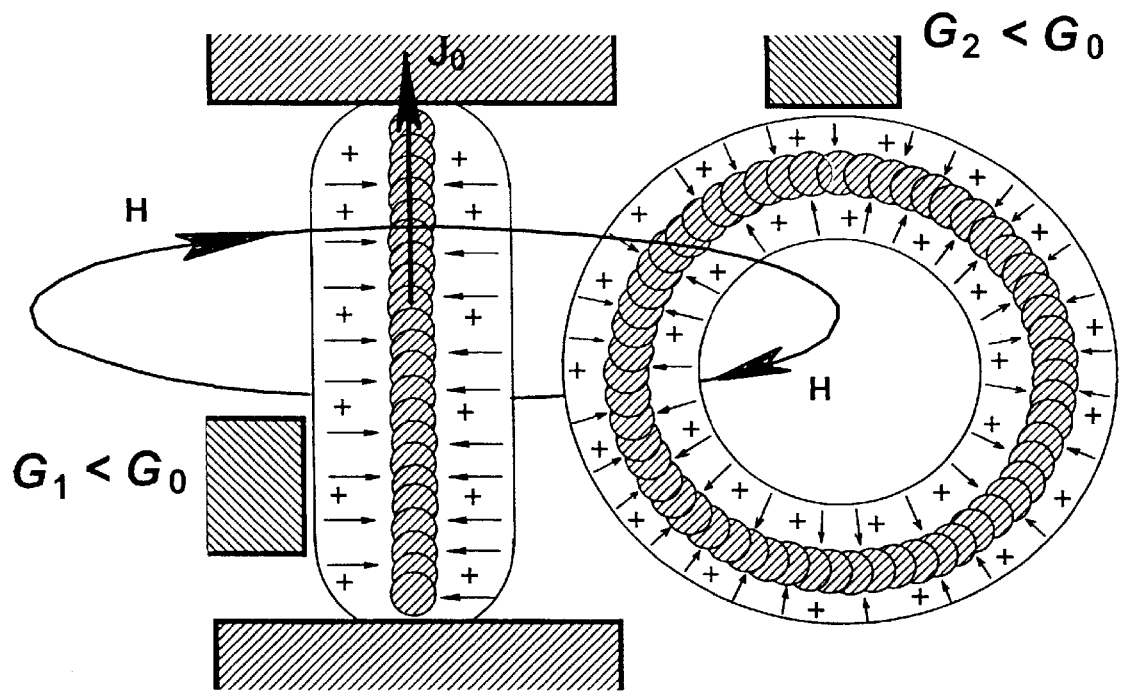
Figure 16D:
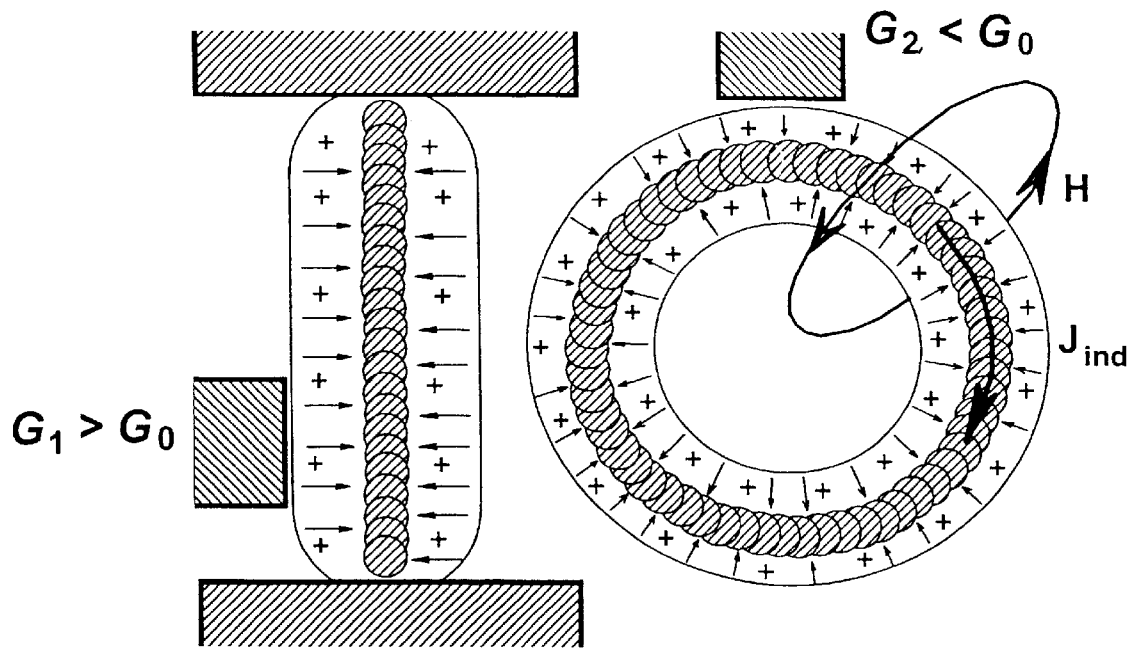

FIGS. 16a–16d depict the steps required to induce persistent current in the circular superpolaron corresponding to logic state "1." In FIG. 16a, logic state "0" (no circular current even at $G2<G_0$) is a starting point where there is no linear current because $G_1>G_0$; 2) Signal $G_2>G_0$ is applied and breaks the loop (not shown); 3) A linear current is switched on because of the gate control signal $G_1<G_0$ (FIG. 16b), but no circular current appears in the broken loop; 4) In FIG. 16c, the loop becomes restored due to $G_2<G_0$ in the presence of magnetic field; 5) In FIG. 16d, the gate control signal $G_1>G_0$ stops linear current, and the change of the magnetic field induces a persistent current in circular superpolaron, logic state "1" state is fixed at the same gate voltages $G_2<G_0$ and $G_1>G_0$ as it was at the starting point shown in FIG. 16a.

Because the signal $G_2>G_0$ during the second step breaks the loop, the circulating current attains a zero value independently of its previous state. To write logic state "0," a similar sequence can be used, with the only difference that during the third step, the voltage of the gate G1 remains greater than $G_0$ and no linear current is allowed to flow. In such a case no persistent current in the loop is present, and logic state "0" is fixed.

Reading the state of such a RAM element can be similar to the reading procedure from long-term memory element described above. Nonetheless, other methods can be used to read the state of such a RAM element.

The sizes of active elements can be comparable to or less than those achieved in conventional semiconductor microelectronics. One advantage of superpolaron based RAM elements is that they can require energy consumption only during the writing-reading process. Once induced, the persistent current in a circular superpolaron (zero for logic state "0" and non zero for logic state "1") can be maintained for a substantial time without the need for external energy. Other advantages include less energy consumption at much higher work frequency, and an ability for non-contact information transfer between neighbor elements.

3 Logic Elements Based on the Switch or Rapid Memory Element with Multigate Control Elementary units (switches and/or rapid memory elements) can be easily transformed to logic blocks if more than one gate is situated near a corresponding nanowire. Examples of such blocks are depicted in FIG. 17. The principles of the operation of the individual elements are described.

Figure 17A:
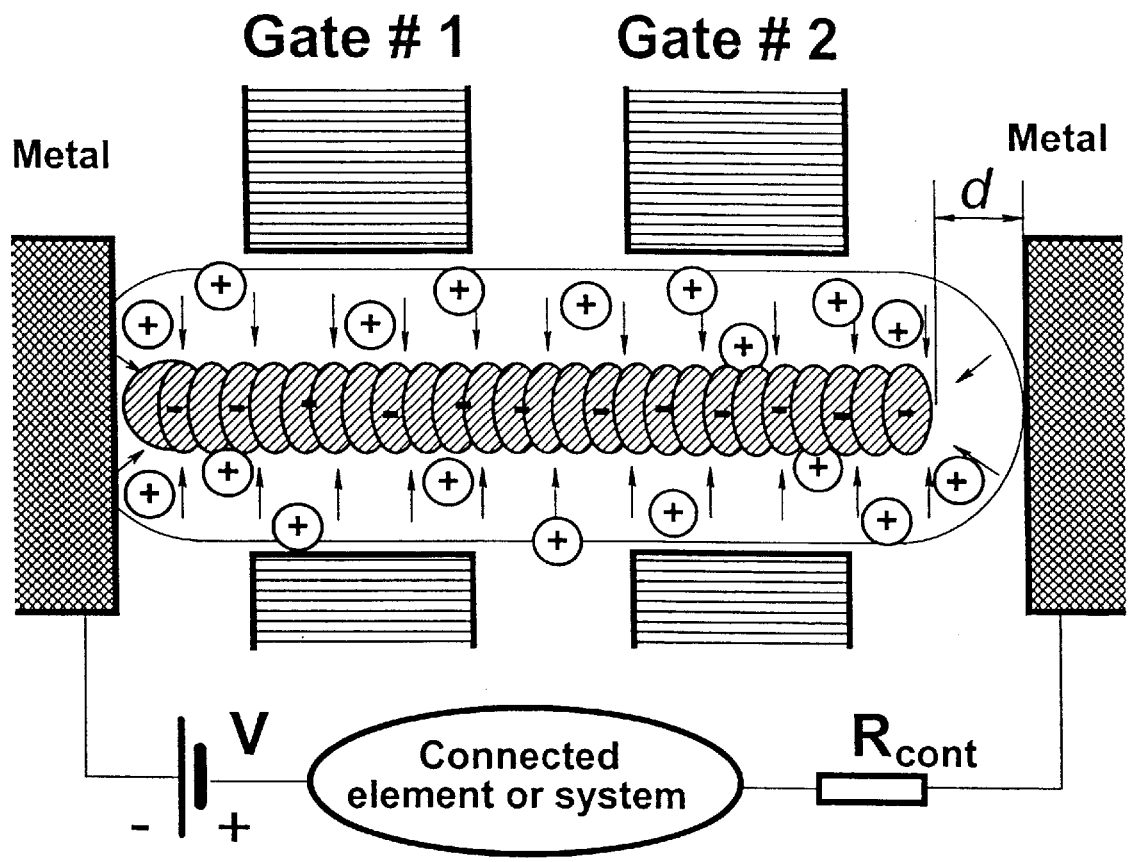
FIGS. 17a and 17b depict "AND" logic blocks and "OR" logic blocks of this invention, respectively.
Figure 17B:
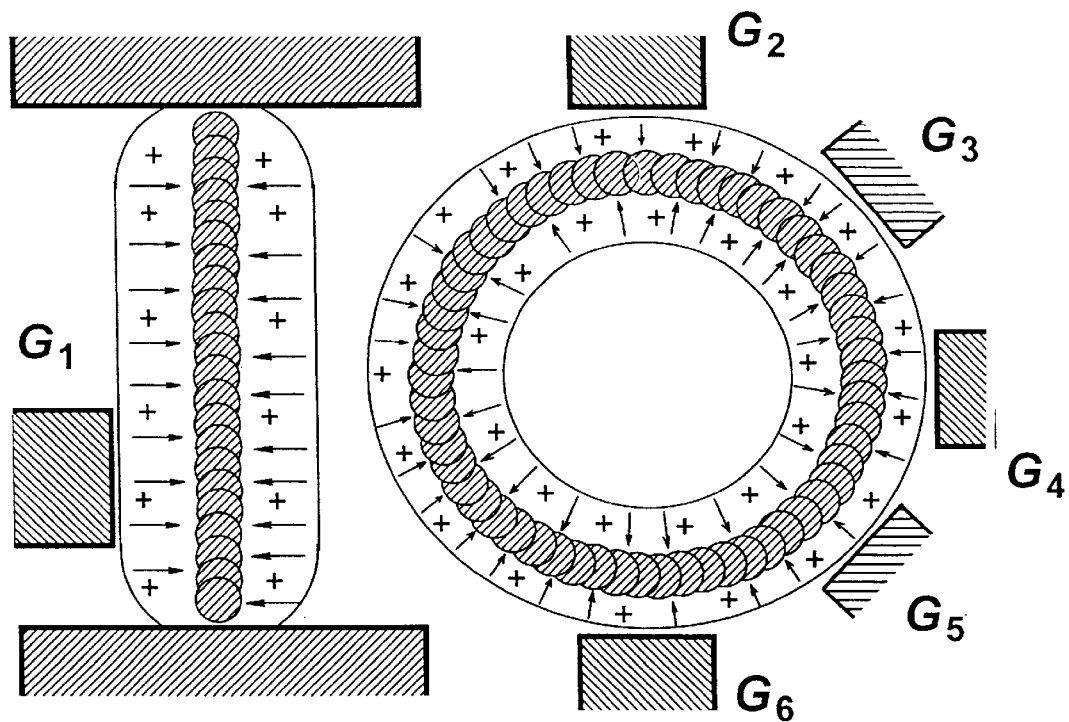

FIG. 17 depicts a logic block incorporating quantum nanowires of this invention. A logic block of the "AND" type is created on the basis of a field controlled switch which becomes open only if the input signals to both Gate #1 and Gate #2 coincide (FIG. 17a). A rapid memory element shown on right (FIG. 17b) can be used as logic block "OR" which attains the necessary logic state if any of gates G2 to G6 provide the necessary input signal $G_n > G_0$.

4 Triple Logic Memory Elements

A circular persistent current in an elementary electromagnetic memory cell provides a new opportunity for the creation of advanced computer techniques. It is well known that triple logic systems using three different logic states "1", "0", and "−1" (herein termed "trinary" logic systems) allows one to develop computers having desirable characteristics. Conventional computers that use binary logic with logic states "0" and "1" cannot resolve the technical difficulty of creating simple logic elements having more than two stable states.

However, electromagnetic memory cells of this invention can be used to solve this problem because persistent current in the same loop can be induced in two different directions at two different times. In this case, logic state "1" state may be represented by clockwise current, logic state "−1" by counterclockwise current, and logic state "0" by zero current. In order to construct a triple logic memory cell, the binary memory cell depicted in FIG. 16 can be supplied with only one additional nanoswitch as it depicted in FIG. 18, thereby creating a trinary memory cell.

Figure 18A:
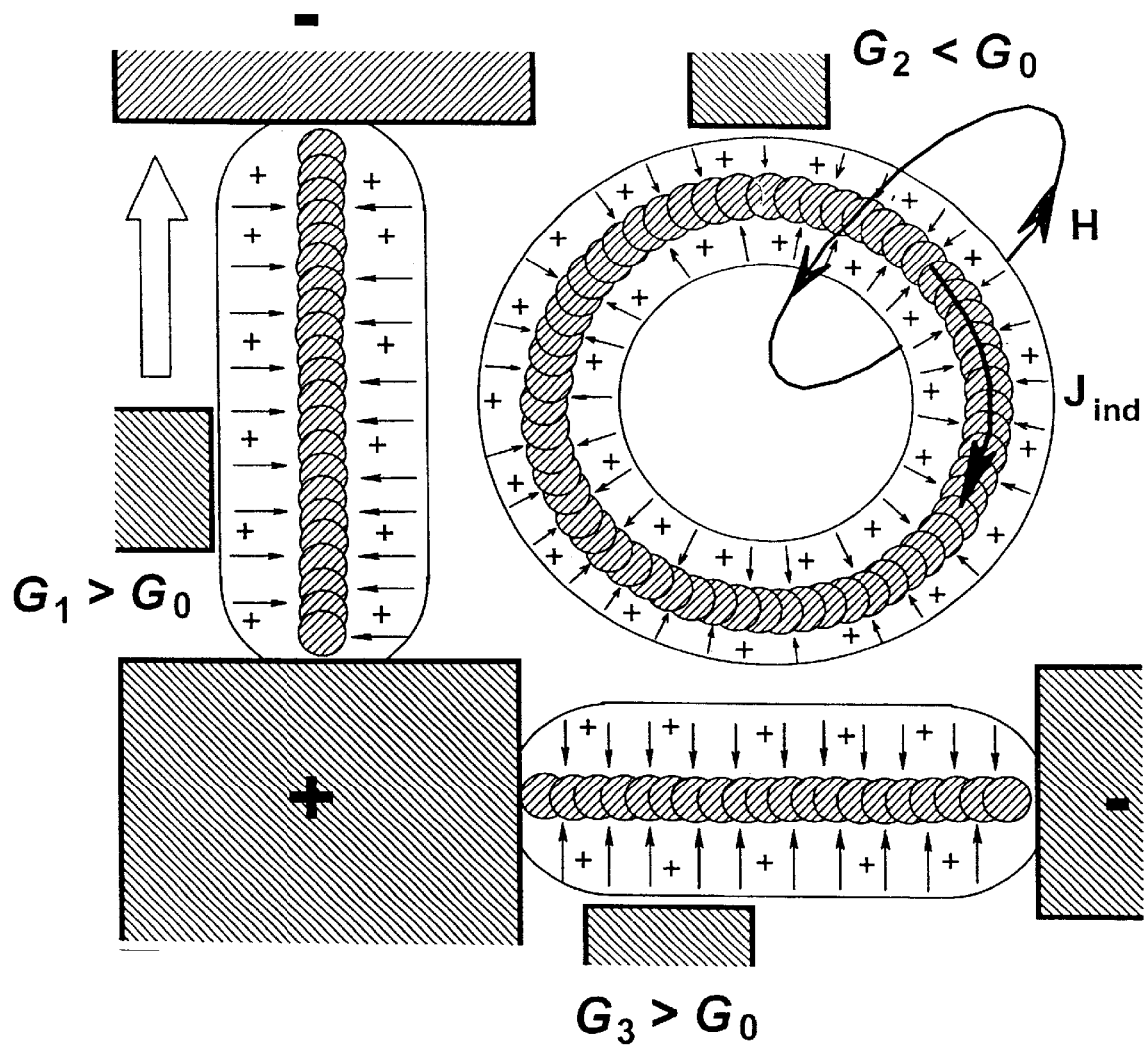
FIGS. 18a and 18b depict trinary logic elements of this invention.
Figure 18B:
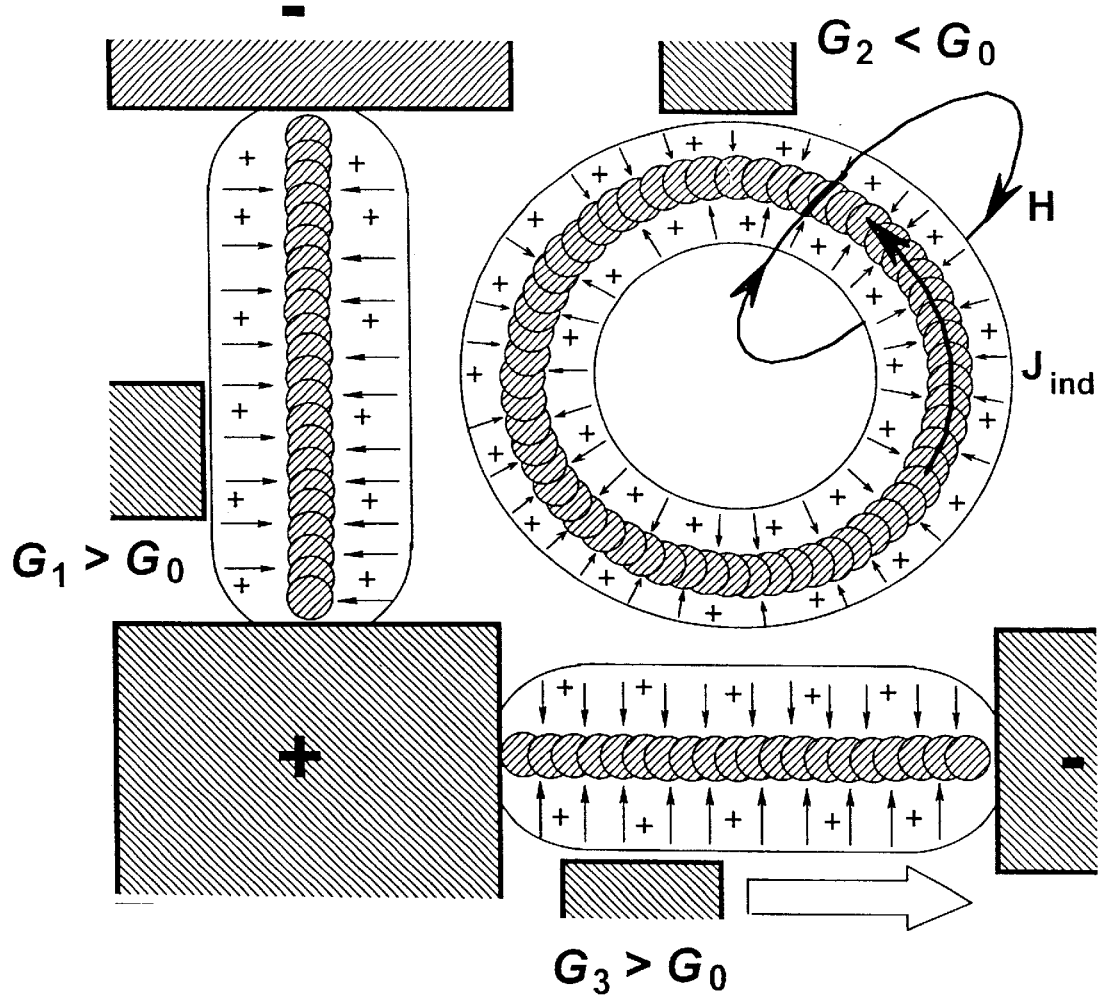

FIGS. 18a and 18b depict a triple logic memory element having two writing nanoswitches. The final state is shown after writing procedure is over: logic state "1" can be written if the vertical switch has been active (FIG. 18a), and logic state "−1" results after the action of the horizontal switch (FIG. 18b), as observed from the direction of the induced current. Logic state "0" (not shown) is created if both switches remain inactive while the writing procedure is carried out. Signs "+" and "−" show the polarity of the electrodes, thick white arrows show the direction of writing currents in each case.

Even the few rather simple examples considered above show how nanoelectronic elementary units formed using superpolarons can fulfill different logic functions. The examples provided herein are not intended to be exhaustive, but only to illustrate how connection of these elements in different combinations can be used to build more complicated logic structures.

5 Nanoprocessors

Using devices made from quantum nanowires and other elements, processors of reduced dimensions can be created. These small processors are herein termed "nanoprocessors." The manufacture of nanoprocessors can be accomplished due to several advantages conferred by the quantum elements of this invention. Specifically, the very low power consumption and small size can permit smaller processors than possible for conventional semiconductors.

Electromagnetic RAM elements can be made that consume energy only for an extremely short time, during the change of logic state, and do not have to consume energy while the logic state remains stable. One can estimate the energetic and other advantages of computers made using elements of this invention in comparison with contemporary ones based on semiconductors.

For purposes of comparison, assume that a semiconductor based processor with frequency $f_{now}=1$ GigaHz consumes 1 energy unit per second all the time, and includes up to $N=10^7$ elements which store and process the information. Consequently, in the best contemporary processors, the total power consumption (CPC)=1 (energy unit)/s, and average power consumption per element (APCE) can be estimated to be $1/N=10^{-7}$ energy unit per element per second.

For conventional semiconductor computers, the maximum speed of logic information treatment doesn't exceed $10^{11}$ bit/s if the processor uses 128 parallel lines for internal information exchange. Actually that means that only 128 elements, corresponding to 0.001% of the whole number $10^7$, are able to change their logic state for a given cycle equal of about $10^{-9}$ s. Therefore, the simultaneous change of logic states of these 128 elements occurring in $10^{-9}$ s, requires the energy approximated by the following relationship.

Instant energetic price of the change of logic states==(Number of lines)×APCE/$f$=128×$10^{-7}$×$10^{-9}$ s=$10^{-14}$ energy unit.

In contrast with the energy required for conventional semiconductor-based computers, the energetic situation in a processor based on quantum RAM elements of this invention are substantially different. Because the transition time in such elements is at least about 100 times shorter than in contemporary semiconducting elements (see FIG. 15), each change of logic states of the similar 128 elements requires at least 100 times less energy, namely $10^{-16}$ energy unit.

The increase of basic frequency of processors of this invention up to $f_{new}=20$ GigaHz and the simultaneous increase of the number of parallel lanes from 128 to approximately 50,000 means that the total power consumption (CPC) in entire processor can be approximated by the following relationship.

CPC=(Number of lanes/128)×$f_{new}$×$10^{-16}$ energy unit=400× 2·$10^{10}(s^{-1})$×$10^{-16}$ energy unit=8·$10^{-4}$ (energy unit)/s.

Thus, power consumption can be reduced to values of about 8·$10^{-4}$ (energy unit)/s. This decrease represents about 1250 times less power needed than existing processors having $10^7$ elements in one layer. Processors based on the above new elements can provide increased speed of information processing from $10^{11}$ bit/s up to 8·$10^{-4}$ bit/s, representing about a 9000-fold increase in computer speed. The combination of decreased power consumption and increased speed can permit increasing the total number of elements in a processor by approximately 500–1000 times. Even with this increase, the total energy consumption is still less than the energy consumption in contemporary processors and the temperature of processors of this invention can be kept within desired limits.

The above performance characteristics can permit development of a new type of processor containing roughly $10^{10}$ logic cells instead of $10^7$ in the best contemporary ones. One reason for the increase in the number of logic cells is that the decreased generation of heat per one cell makes it practical to design multilayer architecture shown in FIG. 19.

Figure 19:
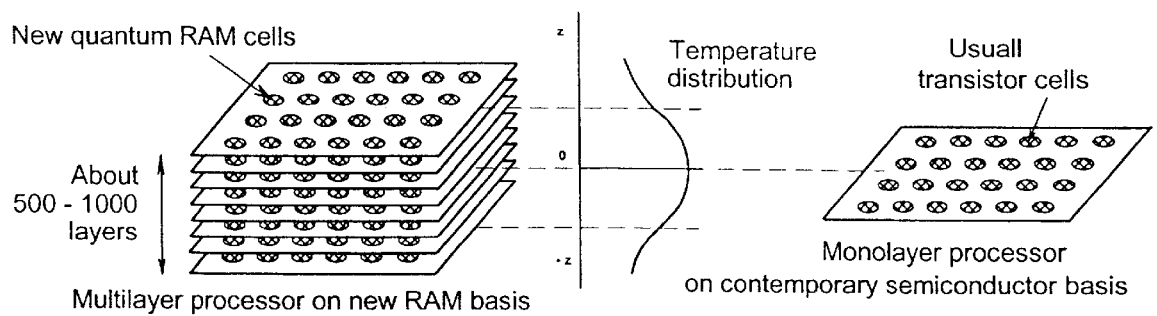
FIG. 19 depicts a multilayered processor of this invention having multiple layers of RAM cells.

FIG. 19 depicts two processors having same energetic and temperature regimes: 1) A multilayered regime based on quantum RAM cells of this invention (left), and 2) a contemporary, single layer regime based on semiconductors (right). In the quantum processor of this invention, the same number of parallel lanes (128) can be used in each layer as in conventional semiconductor processors, but due to a parallel arrangement of all of the 500–1000 layers, the total number of parallel lanes becomes greater by about 1000 times.

An advantage of the use of quantum processors of this invention compared to conventional planar architecture is that in planar architecture, connections between logic elements are by way of direct connections via electric wires. This feature creates some difficulties if one desires either to avoid an intersection of two electric lanes, or to avoid the transfer of signals from one level to another in the z-direction.

The use of electromagnetic RAM elements can reduce this problem and can permit transfer of signals in the z-direction through multiple layers, notwithstanding the fact that each layer may be insulated from neighboring layers by dielectric materials. The idea of such "vertical" non-contact signal transfer is depicted in FIG. 20.

Figure 20:
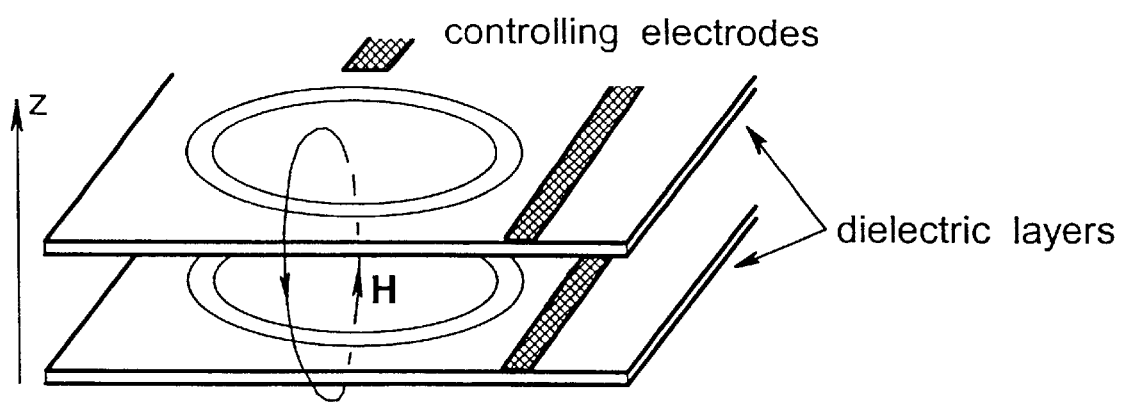
FIG. 20 depicts the transfer of electromagnetic pulse information from one layer of a multilayered processor of this invention as depicted in FIG. 19.

FIG. 20 depicts transmission of electromagnetic pulse information between layers of a multilayered nanoprocessor depicted in FIG. 19. In a bottom layer, a persistent current in a circular superpolaron generates a magnetic field (H) which passes through a superpolaron in an upper layer. The magnetic field so generated induces a current in the upper circular superpolaron, which, in turn, can provide information to other elements on that upper level. Such vertical signal transfer can be controlled by controlling electrodes as described above.

By virtue of the multilayered architecture of the processors of this invention, the quantum processor shown in FIG. 19 (left) can be a truly 3-dimensional processor. Taking into account the increased speed of information treatment described above, one can estimate the speed of signal processing to be as high as or above about $8 \times 10^{14}$ bit/s. For example, by using multilevel nanoprocessors of this invention, the search of a bit of information in an array of $10^{10}$ bits can be accomplished in as little as about 10 microseconds ($\mu s$).

In addition to increasing speed and reducing energy consumption, the quantum processors of this invention can be substantially smaller than conventional processors. For example, if the diameter of one ring-like RAM element is about 500 nm and its controlling electrodes occupy an additional 500 nm of space each, an array of elements can be situated in a plane and can require only about 2 micron or less. Such resolution can be achieved with the use of existing photolithography technology. That means the plane density of RAM elements is at least $2.5 \times 10^7$ cm$^{-2}$ or higher, and therefore, a processor having $10^7$ elements requires an area less than about 0.4 cm$^2$.

In multilayered processors, the z-periodicity between neighbor planes can be about 1 micron. In this case the total thickness of 1000 layers does not exceed 0.1 cm. That means a processor having $10^{10}$ memory elements can be placed in a volume less than about 0.04 cm$^3$. Due to such a small distance between any pair of elements of the processor (about 0.5 cm in any direction or less) the electric signals can travel this distance in an average time of as little as about $10^{-11}$ s.

IV Sensors and Piezomagnetic Transformers and Actuators

Besides their direct use as stationary elements for computers, both passive and active specific functional units can be used in the manufacture of sensors and actuators. Some non-limiting examples of uses of conductive polymer structures of this invention include:

1. local pressure and temperature sensors;
2. high efficiency transformers of electric signals to local mechanical deformation (both static and/or dynamic ones) for use as nanoactuators or in opto-electronic devices, and vice versa,
3. high efficiency nanogenerators providing electric power from local mechanical stress or ultrasonic waves (USW).

A Pressure and Temperature Sensors

As described above, specially designed passive elements may be produced to have high resistance $R_{cont}$, depending mainly on the physical characteristics of tunneling gap d. Tunneling gap d can be approximately constant if used within microelectronics circuitry. That is the case while the dielectric polymer filling the gap is in a glassy state characterized by very high value of Young modulus. Similar results can be obtained using high density cross-linking within a polymer matrix.

The situation changes if the polymer filling the gap is chosen to be in high elastic state (HES) under working conditions, and has rather low Young modulus (Y). Young's modulus for polymers, $Y_{pol}$, is roughly six orders of magnitude less than the Ypol in glassy state (see discussion above). In this case, the gap width d becomes sensitive to mechanical compression if external pressure P is applied. The relationship between these variables is given by the equation:

$$d=d_0(1-P/Y_{pol}) \text{ where } d_0 \text{ is gap's width without pressure}$$

Due to a strong exponential dependence of tunnel contact resistance on d, one can write $R_{cont} \approx e^{kd} = e^{kd_0(1-P/Y_{pol})}$ where $kd_0 \gg 1$ follows from high $R_{cont}$ by definition.

It is seen from this expression that in HES the resistance should exponentially depend on the pressure $R_{cont}=R_{cont}^{(0)} e^{-kd_0 P/Y_{pol}}$ where $R_{cont}^{(0)}$ is a resistance without pressure changes and the sensitivity of such sensor must be rather high because even small changes of $P \ll Y_{pol}$ may cause significant change of the resistance.

In the absence of external pressure the same element may be used as temperature sensor because polymers in HES state can have rather high coefficient of temperature expansion.

$$d=d_0(1+\alpha \Delta T).$$

That results in final expression for high temperature sensitivity $R_{cont}=R_{cont}^{(0)} e^{kd_0 \alpha \Delta T}$ 2 Electro-Mechanical Transformers Contemporary devices using electric signals to cause micro- or nanoscale mechanical movement are usually based on certain solid state piezoelectric materials which have very serious natural restrictions. For instance, the maximal non destructive deformation $\Delta L/L$ of such materials doesn't typically exceed 0.02% and even in static regime requires the application of high intensity electric field all the time to conserve the non zero deformation.

Figure 21:
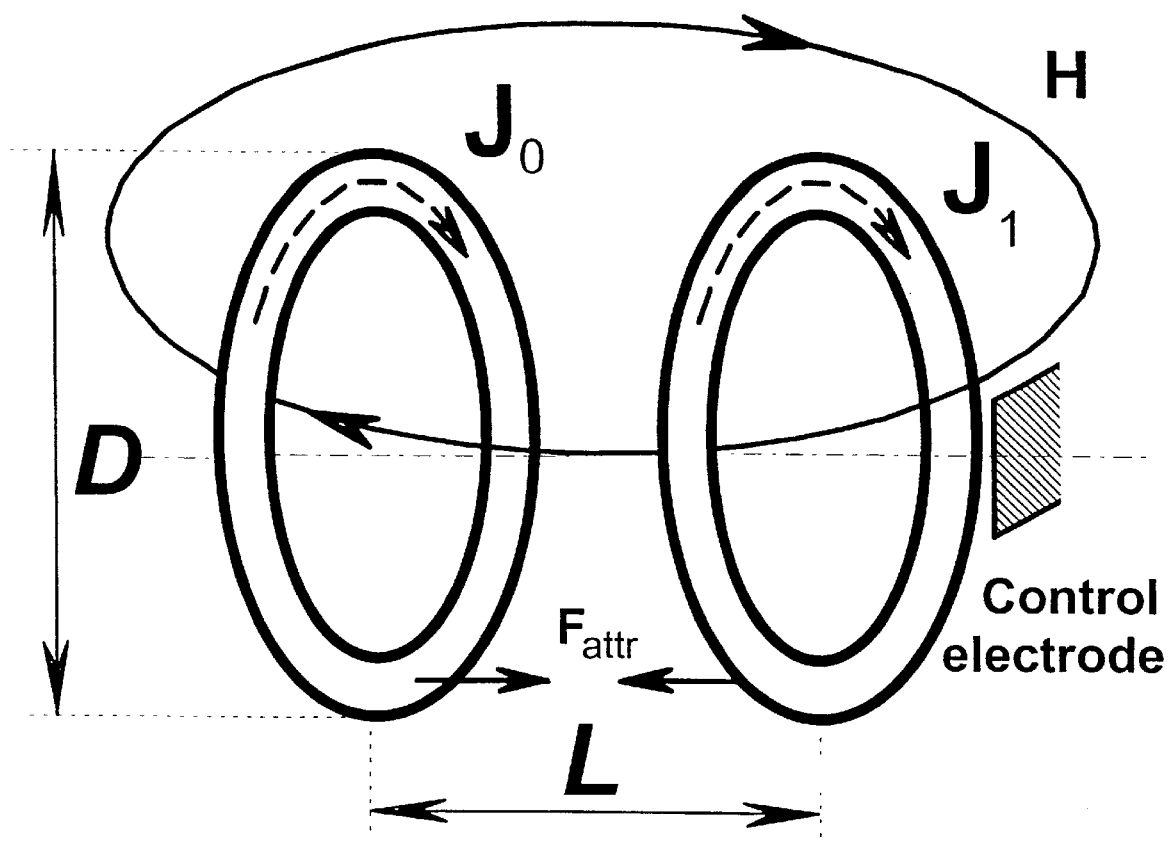
FIG. 21 depicts a piezomagnetic unit of this invention that can transform magnetic interaction of two persistent circular currents in nearby circular superpolarons into a force between the circular superpolarons.

The superpolaronic units (herein called "piezomagnetic superpolarons") formed properly in HES polymer matrices can provide more effective transformation of electric signals to mechanical force. In order to illustrate the effect, consider a system including two closed loop superpolarons as depicted in FIG. 21. FIG. 21 depicts a piezomagnetic unit for transforming magnetic interaction of two persistent currents into a force Fattr that can provide a motive force to change of distance L between the closed loop superpolarons.

As depicted in FIG. 21, both loops are situated in HES polymer medium, and the distance L between two loops is less than or close to their diameters D. In this case, both loops can interact magnetically. Such interaction can be sustained by the current in each loop interacting with magnetic field H created by both currents together. This interaction leads to the appearance of attractive force $F_{attr}$ when both currents have the same direction, and results in elastic deformation (namely, a compression) of the polymer medium separating these two superpolarons.

The force generated can be expressed as follows. Current $J_1$ flows in the conducting ring having diameter D. The velocity v of electrons and their number n in the ring can be related to the mean distance between the electrons $\lambda$ as follows.

$$v = \frac{\lambda J_1}{e}; \quad n = \frac{\pi D}{\lambda}$$

where e—the charge of an electron

If the ring is situated in a magnetic field $H_0$ perpendicular to ring's plane, the Lorenz force F can be created which pushes the ring along its axis according to the following relationship.

$$F = \frac{nev H_o}{c} = \frac{\pi D J_1}{c} H_o,$$

where c is the speed of a light.

Field $H_0$ can be created by a similar circular current $J_0$ flowing in a second ring being separated from the first ring by relatively small distance such that L<D. In this case, $H_0$ doesn't depend substantially on L, and the magnitude of H0 is rather close to the field intensity in the center of the second ring, which can be expressed by the following relationship.

$$H_o \cong \frac{4\pi J_o}{cD}$$

The field intensity H0 can result in an attractive Lorenz force between the two rings if their currents flow in the same direction. Alternatively, a repulsive force can be created if desired, by creating current flows in the two rings in opposite directions.

In circumstances in which each conducting ring is mechanically associated with the surrounding elastic polymer matrix, the force becomes distributed along a certain effective area S in a polymer which is approximately a few times greater than the area of a ring itself, and can be roughly estimated according to the following relationship.

$$S \simeq \frac{4\pi D^2}{4} = \pi D^2$$

That leads to an estimate of the effective average pressure P within this area caused by electromagnetic interaction between two currents and can result in elastic deformation (compression or expansion) of the polymer layer L separating both rings. The magnitude of the pressure can be expressed by the following relationship.

$$P \cong \frac{4\pi}{D^2} \frac{J_0 J_1}{c^2}.$$

The compression Comp caused by pressure P can be expressed by the following relationship.

$$Comp = \frac{\Delta L}{L} \cong \frac{P}{Y_{pol}}.$$

The non-destructive deformation $\Delta L/L$ of about 10% is characteristic for HES polymers and can be reversible if the pressure in the volume between two loops satisfies the condition P<about 0.1 $Y_{pol}$<about 0.1 Kg/cm². This relationship is approximate, and other values within about 1 order of magnitude can also provide satisfactory deformation characteristics. From the formula given above, the magnitude of P necessary to achieve polymer deformation can be achieved when the diameters D of the rings is about 1000 nm and both persistent currents, $J_0$ and $J_1$ are about 0.1 A. If desired, smaller currents, in the range of about 10 mA can provide sufficient force if the diameter D of the rings is reduced to about 100 nm.

The useful life of devices relying upon local piezomagnetic transformation can depend on the persistence of the circular currents, J0 and J1 in the rings. With longer persistence, there is a longer ability of the devices to transform magnetic energy into mechanical force. The formulas provided show that any type of deformation (a shrinkage for the case of parallel currents or an expansion for antiparallel ones) is proportional to $J_1$ if $J_0$ is constant and doesn't change with time. Therefore, by selecting $J_1$ to be less than about 10 mA can permit close control of the deformation from zero to 10%.

It can be readily appreciated that changes in the Young's modulus of the material can also affect the relationship between Fattr and $\Delta L/L$. Thus, a more elastic polymer can exhibit greater deformation than polymers that have lower elasticity.

Several different regimes may be desired. By way of example only, a quasistatic one can be created wherein the required deformation can remain stable for a desired period of time. This regime can be effective in some opto-electronic applications, and in relatively slow mechanical devices. For instance, artificial muscles can be built on this basis.

Alternatively, a dynamic one can be used, wherein local deformations can be made to oscillate. In some embodiments, the oscillations can be at high frequency. Such dynamic regimes can be desirable for rapid opto-electronic devices. Other embodiments can be used to create local ultrasonic generators and receivers, which, for example can be used for wireless signal and energy transfer in nanocomputer and biomedical applications. The idea of dynamic regime can be understood from brief explanation provided below.

In order to evaluate a resonance frequency $f_{res}$, the effective volume $V \approx \pi D^2 L$ of an elastic polymer matrix oscillating between two circular superpolarons can be represented with following mechanical scheme where two masses are related by the following expression.

$$m = \frac{1}{2}\rho V \approx 0.5\rho\pi D^2 L,$$

where each mass is connected with a spring having equivalent elastic coefficient k.

Figure 22:
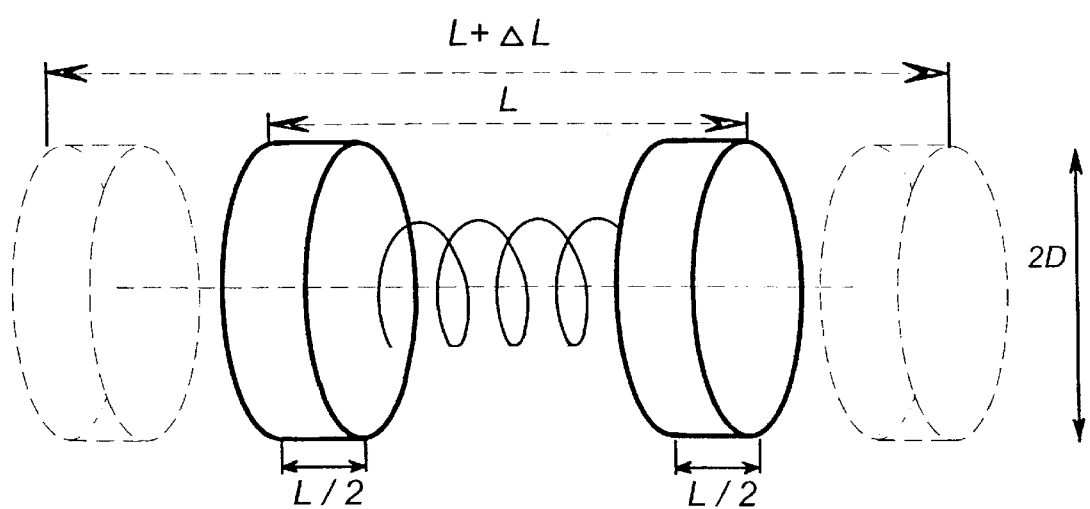
FIG. 22 depicts an oscillating volume of polymer material between two circular piezomagnetic units of this invention as depicted in FIG. 21, wherein oscillations in magnetic fields generate oscillating changes in the distance between the two circular superpolarons.

FIG. 22 depicts the relationship between two circular superpolarons of this invention that are in proximity to each other and whose planes defining the circle are parallel. The term L/2 refers to the height of each cylinder related to oscillating masses (see bottom of FIG. 22).

The superpolarons have diameters D, and in the absence of current, have a separation distance of L. The polymer material separating the circular superpolarons has resilience and is depicted by a helix. Upon the creation of current within the circular superpolarons, a repulsive force is generated between the superpolarons, resulting in a movement of the two superpolarons away from each other by an amount $\Delta L$. The elastic coefficient of the volume between two circular superpolarons can be expressed by the following relationship.

$$k = \frac{2Y_{pol}}{L} S_{effect} \cong \frac{2Y_{pol}}{L} \pi D^2$$

The resonance frequency $f_{res}$ of a mass m on the spring with coefficient k can be expressed by the following relationship.

$$f_{res} = \frac{1}{2\pi}\sqrt{\frac{k}{m}} \cong \frac{1}{\pi L}\sqrt{\frac{Y_{pol}}{\rho}}$$

For example, a polymer having a density of 0.8 g/cm$^3$ and a Young's modulus for the polymer, $Y_{pol}$, of $10^6$ dyn/cm$^2$, one can estimate that $f_{res}$ is about 4 MHz where the distance L between the loops is 1000 nm, and $f_{res}$ is about 40 MHz where the distance L is about 100 nm.

The value for $Y_{pol}$ of $10^6$ dyn/cm$^2$ used above remains valid only until the period of oscillations exceeds characteristic time of polymer relaxation. At higher frequencies, $Y_{pol}(f)$ increases gradually in accordance with particular chemical structures of given polymer. At high frequencies, one has to use transcendent equation which may result in even higher resonance frequency than it has been estimated above. Methods of estimating the transcendent functions are known in the art.

If the direction of current $J_1$ is periodically reversed with frequency f, the small volume of elastic polymer between two loops $\pi D^2 L$ becomes involved in oscillations with the same frequency f because both compressing and expanding pulses repeat periodically. The highest efficiency (and amplitude) of such oscillations can be reached when the externally applied frequency f coincides with or is close to the resonance frequency $f_{res}$. The magnitude the $f_{res}$ is estimated above to be in between about 4 MHz and about 40 MHz if high elastic state modulus $Y_{pol}$ remains applicable in this frequency range. If the elastic modulus increases with increasing frequency, the amplitude of oscillations should decrease but the resonance frequency can increase. The resonance dynamic regime can consume much less energy than non-resonant regime. The dependence $Y_{pol}(f)$ can very for polymers with different chemical structures.

Elements as described above can be used in any situation in which mechanical motion is desired. These applications include but are not limited to motors of small size, herein termed nanomotors." Nanomotors can be used to manufacture robotic devices of a variety of desired sizes. For very small devices, small numbers of nanomotors can be arrayed. For larger motors, larger numbers of nanomotors can be arrayed in series.

3 Transformation of Mechanical Deformation into Electricity

Certain embodiments can be made that can directly produce electricity from mechanical deformation. A two-loop configuration of circular superpolarons is created similar to the configuration described above in FIGS. 20 and 21. A persistent current $J_0$ is formed in one loop. Mechanical deformation of the polymer containing the loops can cause a change in the distance L between the two loops. The relative motion of the two loops can cause a change of magnetic flux through the second loop and can result in the generation of an induced current $J_1$ in it. With the use of control circuitry, the energy of this current can be used to charge batteries or other uses.

Additionally, this type of device has applications in a number of different biomedical applications. By way of example, implanted microelectronic devices can become independent of external sources of electric energy because they can generate electrical energy internally. The electrical current can be generated directly from movements of a patient's body. The electrical signals so generated can be used to control and operate devices including cardiac pacemakers.

4 Quasistatic Opto-Electronic Switch

In other embodiments of this invention, compression of a polymer matrix containing superpolarons can change the refractive index of the medium. The change in refractive index can be used to provide switching based on the ability of a device to either reflect or transmit incident electromagnetic radiation, based on electronic control over the compression of the polymer (an "opto-electronic switch"). The basis for such opto-electronic switches is illustrated by the following relationships between an induced current $J_1$ with refractive index η:

$$\eta(J_1) = \eta_o\left(1 + \frac{\Delta L(J_1))^{-0.5}}{L}\right) \cong \eta_o\left(1 + \frac{\Delta L(J_1)}{2L}\right).$$

Deformation ΔL/L of 10% can result in a 5% change of index of refraction n which can be enough to cause the device to be used as a quasistatic opto-electronic switch (FIGS. 23a and 23b) using the phenomenon of complete internal refraction.

Figure 23A:
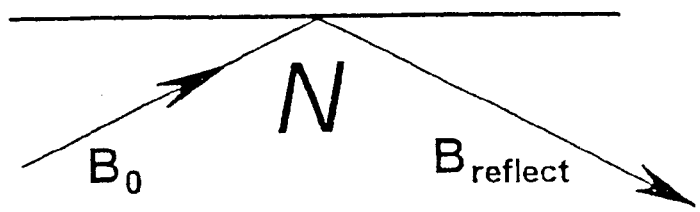
FIGS. 23a and 23b depict two states of a quasistatic opto-electronic switch of this invention.
Figure 23B:
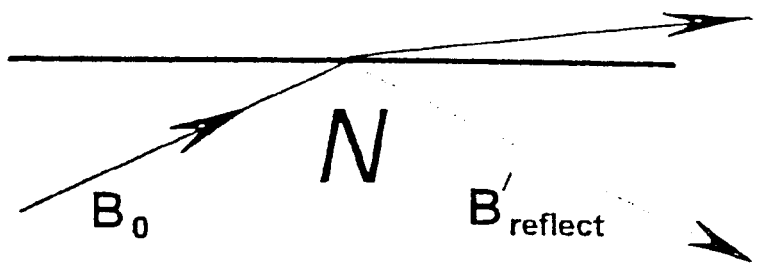

FIG. 23 depicts two states of a quasistatic opto-electronic switch according to this invention. The switch comprises a bilayered material having one lower layer with a more dense polymer and an adjacent upper layer having a less dense polymer creating an interface between them. An incident beam of electromagnetic radiation $B_0$ travels in the more dense medium having an index of refraction N, and falls on the interface with the layer having less density. The index of refraction, n, in the less dense medium can depend on a local current $J_1$ in circular superpolarons. In situations wherein the index of refraction, n<$n_{crit}$<N if $J_1$=0, the incident light beam $B_0$ can not cross the boundary and is reflected completely. In this situation, the switch is closed (FIG. 23a). In situations in which the current $J_1$ is sufficiently high to cause compression of the less dense medium so that n>$n_{crit}$, then beam $B_0$ can pass through the boundary and to travel in new medium. In this situation the switch is open (FIG. 23b).

One advantage of a static regime of such piezomagnetic elements is that due to lower energy dissipation associated with superconducting superpolarons, the signal exciting persistent current $J_1$ may be applied for only a short time. With the appropriate choice of polymer matrix, the switching time can be as short as about $10^{-7}$ s. Once induced, both persistent currents $J_0$ and $J_1$ can interact for long times and keep elastic deformation of the polymer matrix stable. The above scheme of opto-electronic switches provided above is not the only one possible, and others can be proposed based on the principle of changing the refractive index of a polymer at an interface.

V Manufacture of Conducting Superpolarons

Manufacturing superpolarons having high conductivities of this invention involves three elements: a dopant, an organic molecule, and then the materials are reacted to form the superpolaron. Certain organic compounds can have high ionization potentials in the range of about 10–11 eV. The ionization potential can reflect the energy required to create an organic ion and free electron in a vacuum. For such organic compounds, the vacuum ionization potential of a single molecule can be roughly represented as a sum of two main components (see FIG. 24, case a) represented as:

$I_{vac}=E_{Chem}+E_{Vac-sep}$, where a typical value of $E_{Chem} \equiv 2$ eV. This value of $E_{Chem}$ is an estimate of the mean energy required to break a chemical bond during ionization, and where $$E_{Vac-sep} \cong \frac{e^2}{R_{ion}} \cong 8-9 \text{ eV}.$$

$E_{Vac-sep}$ is the electrostatic energy necessary to separate one electron from the ion in a vacuum. In the previous expression, $R_{ion}$ is the typical ionic radius of about ≡0.15 nm. For other ions, the $R_{ion}$ can be different.

The energetic considerations can be different if the ionization of the molecule occurs in condensed organic matter. This process is herein termed "internal ionization." For internal ionization, the term $E_{Chem}$ can remain the same as for vacuum ionization, about 2 eV (for example, see FIG. 24b), but the second electrostatic component can become reduced due to a high frequency dielectric constant inherent forgiven condensed medium. Usually, the high frequency dielectric constant $\epsilon_{28}$ can depend upon the specific chemical composition and for certain organic dielectrics is in the range of about 2 to about 2.4. Under these circumstances, the second component of the internal ionization in a condensed medium $I_{Med}$ can be expressed by the following relationship:

$$E_{Med-sep} \cong \frac{e^2}{\varepsilon_{\infty} R_{ion}} \cong 3.3-4.5 \text{ eV}.$$

A corresponding potential of internal ionization can be expressed by the following relationship: $I_{Med}=E_{Chem}+E_{Med-sep} \equiv 5.3-6.5$ eV. The above value represents the energetics of only a so-called vertical ionization which involves pure electronic processes, and does not take into consideration additional processes of structural reorganization within the medium following charge separation. One possible secondary process that may occur after ionization is the formation of solvating shells which can appear gradually in a polar liquid medium around both positive and negative separated charges. Such solvation can be energetically favored if it provides some energetic gain. Under certain conditions, such energy gains typically do not exceed 1–2 eV inorganic medium containing a modest concentration of polar groups.

Figure 24:
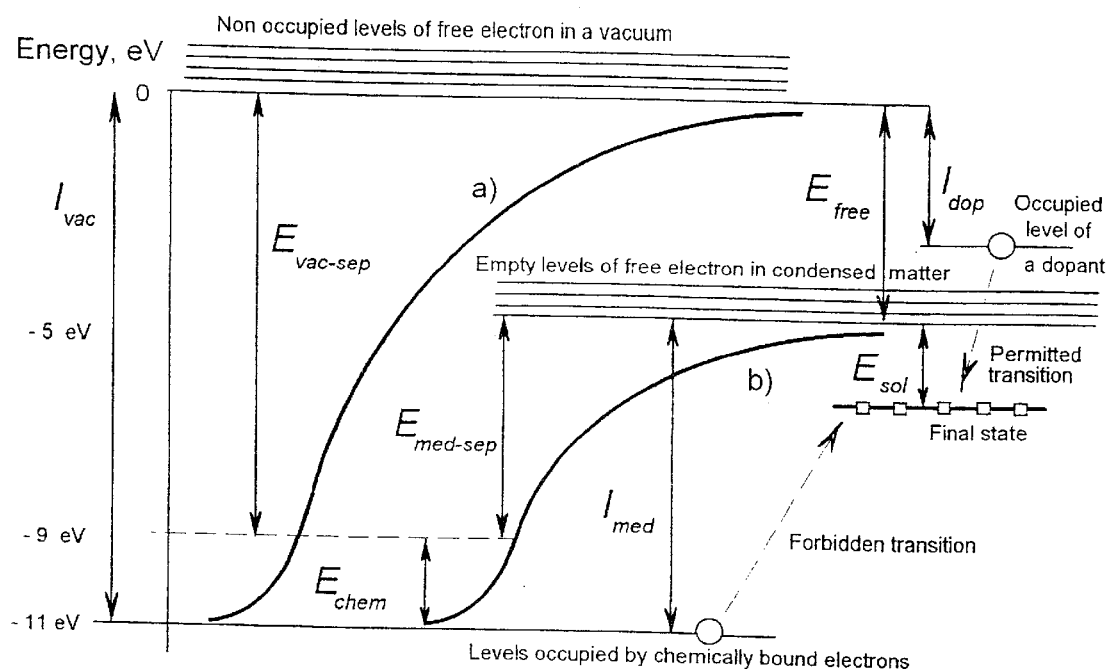
FIG. 24 depicts relationships of electrical potentials and transitions of electrons between different states in chemical moieties and in vacuum.

The above thermodynamic considerations can result in two important consequences:

a) The energy of 5.3–6.5 eV required for internal ionization of typical organic condensed liquids is within the known window of a transparency of several types of organic dielectrics falling within the far ultraviolet range having wavelengths of about 0.23 to about 0.19 nm. Obviously, even this lowered energy remains to be too high for spontaneous creation of stable organic ions and free electrons, even in cases in which an additional gain of about 1–2 eV is taken into account. Any free electron whose accidental appearance in such medium is due to temporary external ionizing factors (UV-light, electron beam, or cosmic rays, and so on) may have rather limited life-time, and can recombine immediately after the ionizing energy source is terminated.

b) If an external doping agent is used as a source of free electrons, thermodynamic considerations can be different. Electrons arising from dopants can be placed only on empty levels of the system whose energetic position within an organic condensed substance. Similar thermodynamic principles as described above can be used to estimate the energies necessary to maintain stable ionization of dopants in organic media. Those skilled in the art can appreciate that those non occupied levels available for free electrons are shifted below of the level of free electron in a vacuum as shown in FIG. 24, case b, in accordance with following equation:

$$E_{Free} = I_{Med} - I_{Vac} = E_{Med-sep} - E_{Vac-sep} \cong -\frac{e^2}{R_{ion}}\left(1 - \frac{1}{\varepsilon_{\infty}}\right) = 3.5-5.7 \text{ eV}.$$

Formation of stable ions and free electrons from an external doping agent can include two steps. First, a rapid vertical transition of an electron from the level within said doping agent to an empty level; and second, a relatively slow solvation of separated charges accompanied by a structural relaxation. Such process can be thermodynamically favored if $E_{Free}+E_{Sol}>I_{Dop}$, where $I_{Dop}$ is the ionization potential of the doping agent. Taking into account quantitative estimates given above, a value of $I_{Dop}$ of about 4.5 to about 7.7 eV or even less can further the creation of stable ions and free electrons in organic dielectric matrices. The particular estimates provided here are for illustration only, and that other estimates can be obtained for other doping agents, organic substances, and/or other variables are chosen. Additionally, the above-described approach can be applicable to a variety of different organic materials, in either liquid or solid form, independently of the molecular weight.

A Dopants

In general, any dopant can be used to manufacture superconducting superpolarons of this invention if the ionization potential permits the ionization of the dopant. Dopants especially useful have ionization potentials less than about 7 eV. Described below in Table 1 are some elements having ionization potentials in this range. (Data taken from handbook: *Energies of chemical bonds. Ionization potentials, and electron affinities*, Ed. V. Kondratyev, Moscow, Science, 1974), incorporated fully herein by reference.

TABLE I

Elements and Their Ionization Potentials

| Element | Li | Na | K | Rb | Cs | Sr | Ba |
|---|---|---|---|---|---|---|---|
| Ionization potential (eV) | 5.4 | 5.14 | 4.34 | 4.18 | 3.89 | 5.69 | 5.21 |
| Element | Al | Ga | In | Ce | Pr | Nd | Pm |
| Ionization potential (eV) | 5.98 | 6.0 | 5.79 | 5.47 | 5.42 | 5.49 | 5.55 |
| Element | Sm | Eu | Tb | Dy | Ho | Er | Lu |
| Ionization potential (eV) | 5.63 | 5.66 | 5.85 | 5.93 | 6.02 | 6.1 | 5.43 |

In addition to the elements described in Table I above, other inorganic molecules and radicals can be used. Examples of suitable molecules and radicals are provided in Table II below.

TABLE II

Inorganic Molecules and Radicals

| Radical | VO | TaO | CeO | PrO | NdO | UO | $UO_2$ |
|---|---|---|---|---|---|---|---|
| Ionization potential (eV) | 5.5 ± 1.0 | 6.0 ± 0.5 | 5.2 ± 0.5 | 4.9 ± 0.5 | 5.0 ± 0.5 | 5.72 ± .06 | 5.5 ± 0.1 |
| Radical | CaOH | CaF | CaCl | SrO | SrOH | $Sr_2O$ | SrF |
| Ionization potential (eV) | 5.9 ± 0.1 | 6.0 ± 0.5 | 6.0 ± 0.1 | 6.1 ± 0.5 | 5.55 ± 0.1 | 4.8 ± 0.5 | 4.9 ± |
| Molecule or radical | $MoO_3$ | BaO | BaOH | BaF | BaCl | $Li_2O$ | $Cs_2O$ |
| Ionization potential (eV) | 6.2 ± 1.0 | 6.5 ± 0.3 | 4.5 ± 1.0 | 4.9 ± 0.3 | 5.0 ± 0.1 | 6.8 ± 0.2 | 4.45 ± .06 |

In addition to inorganic molecules and radicals, certain other, more complex organic molecules and organic/elemental compounds can be useful dopants. Examples of those materials are provided in Table III below.

TABLE III

Organic and Element-Organic Compounds

| Molecule or radical | $(CH_3)_3$ CH | N,N,N',N'-Thetramethyl-n-phenylendiamin | $(C_5H_5)_2$ Ni | $(C_5H_5)_2$ Cr | $C(CH_3)Fe(CO)_3$ |
|---|---|---|---|---|---|
| Ionization potential (eV) | 6.93 ± 0.05 | 6.18 ± 0.03 | 6.2 ± 0.1 | 5.5 ± 0.05 | 6.42 ± 0.05 |

The examples of dopants provided in Tables I, II and III above are for illustration only. Many other types of dopants can be used and remain within the scope of this invention.

B Organic Molecules

Certain superconducting superpolarons of the present invention can self-assemble in some organic liquids under certain thermodynamic conditions. In many usual organic substances, valence electrons can be strongly bound within chemical bonds and few free electrons may exist.

In certain embodiments, it can be desirable to select organic molecules and dopants in which the organic molecule can accept a dopant electron easily. If the organic molecule accepts an electron from a dopant, then the tendency for side reactions that produce uncharged species can be diminished. According to one possible theory, chemical instability of adoping agent can result from the same valence electron both being potentially available to participate in side reactions as well a to become a free electron. To diminish the tendency of a dopant to form uncharged products, one can select a basic organic compound having chemical structure allowing it to serve as electron acceptor. Organic moieties that more readily accept an electron from a dopant can decrease probability of a side reaction. Such a shift of electron density from a doping agent to an acceptor does not necessarily imply the complete ionization of a doping agent. Rather, in some embodiments, even an incomplete ionization, known herein as a "preliminary" or "quasi-ionization" can diminish the likelihood of formation of uncharged products of side reactions.

Additionally, in certain embodiments, it can be desirable for the organic component to provide a sufficiently large preliminary spatial separation of both a captured electron and a positive charge remaining on a doping agent molecule after its quasi-ionization. For certain situations, it can be advantageous for the spatial charge separation to occur before the separated charges are stabilized by solvation. It can be desirable for the interaction between a doping agent and an organic compound to produce a charge transfer complex which may or may not provide a final free electron. It can be especially desirable in certain embodiments for the charge transfer complex to be formed rapidly. The charge transfer complex could be an intermediate precursor of both a free electron and a stable organic ion. Additionally, the precursor can exist either as a part of macromolecular chemical structure or within a condensed medium as a relatively low molecular weight compound.

In accordance with the above considerations, for certain embodiments of this invention, the basic organic compound chosen can contain two different types of functional groups: electron-acceptor groups having an increased electron affinity (EA) and a separate group having high affinity to an increased density of positive charge, herein termed a "positive ion affinity group" ("PIA"). For instance, proton-acceptor groups can be one example of a PIA. If a doping agent D is introduced in the medium containing both EA and PIA groups, interactions with said doping agent can transform at least some part of the basic organic molecule into a charge transfer complex as shown by the following relationship:

$(EA)^{\delta-} \ldots [D \ldots PIA]^{\delta+}$ where $\delta \leq 1$, and where $\delta$ is the valence electron density.

If there is appropriate distance between EA and PIA groups, this type of charge transfer complex can correspond to the preliminary spatial separation of charges desirable although both positive and negative charges can still be bound by Coulomb forces. The chemical activity of the doping agent D can drop after the dopant becomes trapped within the positively charged complex form [D ... PIA]$^{\delta+}$. In such circumstances, the dopant can lose a part of the valence electron density ($\delta \leq 1$). In these situations, the probability of side reactions can be decreased if the PIA groups have a positive charge affinity for $\delta$close to 1. These conditions can provide a quantitative estimation of the strength of a particular charge transfer complex.

After the formation of a charge transfer complex precursor, two spatially separated solvating shells can form which surround both of the preliminary separated charges. Solvation processes can be energetically favored and when present, can result in even stronger charge separation. Solvation processes can be kinetically controlled and can depend on both time and temperature. In especially desired combinations of dopants and organic molecules, rapid formation of charge transfer complexes precursor are followed a by relatively slow period of time during which charge separation results in a gradual formation of stable organic ions and free electrons. According to one possible scheme shown below:

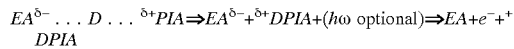

$$EA^{\delta-} \ldots D \ldots {}^{\delta+}PIA \Rightarrow EA^{\delta-} + {}^{\delta+}DPIA + (h\omega \text{ optional}) \Rightarrow EA + e^- + {}^+DPIA$$

This process possesses a non-zero, positive activation energy and, therefore can be accelerated by either heating or irradiation of the substance with light quanta within an appropriate wavelength band. Additionally, the reaction can proceed without either added heat or irradiation by long term annealing at ambient temperature.

Precursor formation as well as final charge separation can be associated with some chemical and structural reorganization of molecules. Reorganization can occur when there is sufficient mobility of dipole groups within the medium. In certain embodiments, it can desirably take place in either liquid or visco-liquid medium. If the fluidity of the medium is relatively high, both the molecules of the basic organic material and/or the low weight solvent molecules can act to solvate ions and free electrons providing an energetically favored state. It can be especially desirable for the molecules to contain groups having a high dipole moment.

In certain other situations, PIA groups can be selected that have relatively low positive charge affinity resulting in $\delta \ll 1$, or that provide low spatial charge separation due to a small distance between EA and PIA groups. For such PIA groups, the density of valence electron orbit considered does not "leave" a doping agent but remains distributed over both the EA group and the rest of the doping agent molecule joining EA group. This electron can thus create a so-called "radical-anion+cation" pairing where the directions of spin of non paired electrons can be equally probable. If two radicals of the same kind meet, they can recombine and form a new stable chemical bond thereby preventing strong charge separation. Instead of ionization, the recombination of radicals can result in a non-charged molecular product having the structure resembling a dipole group as depicted below:

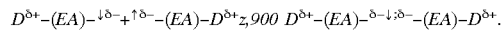

$$D^{\delta+}-(EA)-\downarrow^{\delta-}+\uparrow^{\delta-}-(EA)-D^{\delta+}z,900\ D^{\delta+}-(EA)-^{\delta-\downarrow;\delta-}-(EA)-D^{\delta+}.$$

For example, organic compounds containing ester (—COO)— or ketone (>C═O) groups having significant electron affinity can participate in chemical reactions with alkali metals in an inert solvent at elevated temperatures accompanied by the formation of radical-ion products which can become further transformed into electrically neutral di-ketone structures. Mueller, et al., *Electrochem* 45: 380 (1939); Morantz, et al., *Trans-Faraday Soc.* 51: 1375 (1955), both references herein incorporated fully herein by reference.

The probability of the formation of radical-anion+cation pair can be lowered by providing PIA groups in a basic material having an affinity to positive charge which is sufficiently high. If EA and RIA groups are included in the same molecule, the introduction of a spacer of an appropriate length can provide sufficient distance between the charges.

Many precursors suitable for formation of superpolarons of this invention can simultaneously combine features of both a charge transfer complex and a radical-anion+cation pair. In situations in which the precursor molecules can tend to form radical-anion+cation pairs, it can therefore be desirable to select reaction conditions in which side reactions are not favored.

One way to address the problem is to take into account that the processes of recombination of radicals into uncharged species and the final charge separation are, at least in part, kinetically controlled. The relative rates at which the two types of reactions can occur can depend on the rate constant of the chemical reaction, the order of the chemical reaction, and the concentrations of participating chemicals.

Final charge separation can be described as a monomolecular decay of the charge transfer complex precursor as a first order reaction having a rate that is proportional to the precursor concentration of the charge transfer complex. The decay reaction does not usually require long distance movement of molecular components, and its rate constant therefore does not usually depend on the medium's macroscopic viscosity.

In contrast with charge separation reactions, a radical-anion+cation pair recombination typically involves an interaction of two radicals and therefore is a second order reaction. The rate of a second order chemical reaction can be proportional to the square of the concentrations of the precursors. At low concentrations, the mean distance between two radicals may be so high that they meet each other only after traveling long distances within the medium and therefore, such meetings can be relatively rare and the rate of the resulting reaction can be relatively show.

Therefore, in situations in which undesirable side reactions can occur, to produce final charge separation, it can be desirable to select relatively low concentrations of the reactants, so that the concentrations of anions and cations of the charge transfer complex is relatively low. The concentration of precursors can be sufficiently low to disfavor radical anion+cation pair recombination yet sufficiently high to provide a desirable final concentration of free electrons in the matrix.

Macroscopic viscosity of the medium can also control the rate of recombination reactions. Thus, radical anion+cation pair recombination can be disfavored by the use of organic polymer materials having viscosity that is sufficiently high to decrease the rate of second order reactions to a desired low level. The dependence of second order reaction rates on viscosity of the medium can also apply in the case of low molecular weight organic compounds having viscosity which is much lower than that of macromolecular species. In contrast, the desirable charge separation reaction, being described as a first-order reaction, is less dependent upon viscosity. Therefore, increasing viscosity can be beneficial by substantially decreasing the rates of undesirable second order reactions, and only slightly decreasing the rates of desirable first order reactions.

As described in the examples above, the organic material selected can contain both EA and PIA groups within one molecule. Additionally, desirable superpolarons of this invention can be obtained for liquid organic media containing a mixture of two different types of molecules. A first type can contain EA groups and as second type can contain PIA groups. In these situations, a charge transfer complex can be formed when the doping agent D interacts with at least one of each of the two types of molecules.

Several chemically distinctive groups may be considered as proper EA and PLA groups. The first group, of EA groups, for example, can include oxygen- and halogen-containing moieties like →C=O, —COO, —CHO, >C=S, >CCl, >CF, etc. The second group, of PIA groups, can include >NH, —NH$_2$, —NHR, —NR$_2$, etc. (where R is an organic radical). These EA and PIA groups can be present in a wide variety of different aliphatic, aromatic and/or organic-element compounds, can be active participants in electron-chemical processes described above, and can simultaneously be used to create a wide variety of organic materials. Suitable organic materials include those having polymerizable double bonds and/or functional groups permitting polymerization, polycondensation, or other polymeranalogous reactions resulting in formation of high molecular weight compounds in which quantum nanowires can be created. In polymer macromolecules the EA and PIA groups can be inserted in either polymer backbones or side chains. The EA and PIA groups can be placed either near each other, or relatively far from each other. Polyesters, polyamides, polyketones as well as side chain acrylate based polymers, polysiloxanes, and polyvinyl esters can be especially desirable polymer materials to be used for nanowires preparation.

By way of example only, other organic materials suitable for forming quantum nanowires of this invention are included below. When two functional groups like —COO and NR$_2$ can be present in one molecule, and an alkali metal can be used as a doping agent. In the examples below, the amino (NR$_2$) groups can be considered PIA groups, solvent organic compounds having no PIA groups and containing ester (—COO)— or ketone (>C=O) groups (EA groups) can also react with alkali metal dopants. However these species may produce electrically neutral di-ketone structures through radical-ion formation (see references to E. Mueller et al, and D. Morantz et al, incorporated herein). In these situations, it can be desirable to provide PIA amino groups in the same molecule together with EA COO or C=O groups to decrease the likelihood of formation of radical-anion+cation pairs. Such a choice of active groups within the same molecule can be desirable because of the strong interaction of the amino group with a positive charge of an alkali metal ion, whereas an electron provided by a metal atom can strongly interact with carbonyl oxygen atoms to form a charge transfer complex that is then followed by the charge separation and free electrons formation.

C. Quantum Nanowires Having Macromolecular Ions

In certain embodiments of this invention, quantum nanowires can be made using organic macromolecules. These products can have viscosities sufficiently high to make structures made with them stable. Depending on the size of the macromolecules, the viscosity and other properties can be selected to provide desired physical and chemical properties. By using higher molecular weight molecules, the viscosities can be higher than that viscosities of polymer materials made using either lower molecular weight macromolecules or small organic monomers.

EXAMPLES

In the examples that follow, the organic molecules by themselves are not highly conductive. Rather, the low and high molecular weight molecules remain in an insulating state. Instead, electron threads formed within such organic medium can be superconducting.

Example No 1

Superconducting Nanowires in High Viscosity Poly (Dimethyl-Amino-Ethyl-Methacrylate)

To form a high viscosity medium containing superconducting nanostructures made in poly(dimethyl-amino-ethyl-methacrylate), the following series of steps were carried out. Each step comprises individual sub-steps as indicated.

Step 1: Forming a Liquid Medium Comprising a Macromolecular Substance and a Dopant (a) A two gram sample of poly(dimethyl-amino-ethyl-methacrylate) having a mean molecular weight of 100,000 atomic mass units (amu) was dissolved in 8 grams of the toluene to create a solution having about 20 weight % polymer. This solution was transparent and had no color. Toluene has very little, if any, polarity. The polymer has both amino groups and ester groups each having high dipole moments. One drop of this solution was taken to analyze its magnetic properties.

(b) A small open flask containing the solution formed in step (a) was heated to a temperature of 65–70° C. for 15 min. During this step, the air was substantially removed from the atmosphere and was replaced by toluene, and traces of molecular water and oxygen were removed from the solution.

(c) A small piece (about 0.04 gram) of metallic potassium was placed into the solution in the flask. Because the melting point of potassium is 63° C., the metal melted. As the potassium melted, it became distributed in the solution, so that after approximately 30 min., the melted potassium formed a homogeneous, transparent liquid medium having a faint red-brown color. The color developed as the interaction between the potassium and dissolved polymer formed a prior potassium-polymer charge transfer complex. The process was complete after 30 min. One drop of this medium was taken to analyze its magnetic properties.

Step 2: Generating Macromolecular Ions and Free Electrons

This step was carried out to induce a more complete charge transfer reaction between the macromolecular substance and the doping agent in the presence of chemical groups having high dipole moments to generate macromolecular ions and free electrons.

(d) Approximately 0.5 gram of the medium prepared in step (c) was then taken from the flask and was mixed with 0.025–0.05 gram of acetone on the surface of a flat piece of glass. This was done in to increase both the strength and the concentration of the easily moving polar chemical groups in the medium. The area occupied by this liquid drop finally obtained on the glass was roughly 5 cm$^2$, so that mean thickness of liquid medium layer was about 1 mm. This layer was sufficiently thin to be transparent for visible and near UV-light. Another drop of the medium was taken to analyze its magnetic properties before illumination.

(e) The liquid layer formed in step (d) was irradiated for 10–15 min using non-filtered light from a high powered mercury lamp having an electric power of 100–120 Watts, and a bulb length of 3–4 cm. The lamp produced a broad spectrum of electromagnetic radiation, and the distance between the bulb and the surface of the liquid layer was approximately 10 cm.

Due to the high power of the lamp, the temperature of the sample increased slightly. The estimated temperature during exposure to radiation was about 40° C. After illumination the medium became a little bit more viscous than it was before.

After step 2 was complete, the remaining medium became a pale weak yellow color showing that a more complete charge transfer reaction was induced during this step 2 in the medium in the presence of chemical groups having high dipole moment, and stable positive macromolecular ions ("macroions") and free electrons had been formed.

Step 3: Forming Quantum Nanowires

This step was carried out to permit the medium to form a phase in which the content of macromolecular substance exceeds 5 weight % to allow said free electrons to form said quantum nanowires.

(f) After the irradiation was completed, five samples of visco-liquid medium were prepared to measure their magnetic properties. Each sample was the drop of the medium taken from the glass surface with the help of glass knife and placed into a small basket made of copper foil. Magnetic properties of all baskets were previously measured to be sure they did not contain magnetic contaminants by placing them into a magnetometer. Any baskets having contaminants were discarded.

Initial masses of the samples varied within the range 0.025–0.05 gram and the mass of the samples changed gradually with time due to slow evaporation of low molecular weight solvents. The preparation of samples and their careful weighting took approximately 40 min. Room temperature magnetic measurements of each sample were within the range 0.01–6.8 KGauss, and took about 25–30 min.

(g) The intermediate samples taken in the end of points (a), (c) and (d) exhibited normal low diamagnetic responses consistent with the known magnetic properties of the components. Therefore, all of the chemicals used have contributed no magnetic contaminations into the medium.

All five final samples measured in the end of point f) showed strong ferromagnetic responses. The ferromagnetic responses correspond to collectivized electron spin concentrations (i.e., free electron concentrations) within the range of $1.3 \times 10^{18}$ per gram, or approximately $1.3 \times 10^{18}$ cm$^{-3}$ calculated assuming the density of the medium was about 1 gram×cm$^{-3}$. The unusually high free electron density is a characteristic signature of quantum nanowires. The presence of such high electron densities proves their formation in the medium while point f) of step 3.

(h) The next day, measurements of the same samples were made, and we found a slight increase of ferromagnetic signals of on average 10–15%, due to continued evaporation of solvents from the visco-liquid medium. The increase in ferromagnetic signals correlated to an increase in the concentration of collectivized spins related to the mass (or volume) of more than 40%.

The final material was a viscous liquid, with no phase separation in the medium, and thus had no Young's modulus. Moreover, this material contains stable quantum nanowires and a macromolecular substance concentration of at least 30–35 weight %.

In the further descriptions that follow, we will provide descriptions of other embodiments of this invention. However, details are provided only if they are significantly different from those described above.

Example No: 2
Superconducting Nanowires in Low Viscosity Poly(N,N-dimethylaminoethylmethacrylate)

In other embodiments, the polymer matrix is otherwise the same as for Example No: 1, with the only difference being the initial amount of a toluene. In this Example, the amount of toluene was 48 grams and the initial concentration of the polymer in the solution is about 2 weight %.

Analysis of final samples (Step 3, g) showed the ferromagnetic signature characteristic of quantum nanowires. Nanowires providing the characteristic ferromagnetic properties appeared as solvent was permitted to evaporate and the concentration of macromolecules in the medium exceeded 5–6 weight %. As with Example No: 1, Example No: 2 was a liquid, and therefore, had no Young's modulus.

Examples Nos: 1 and 2 are liquids, in spite of the differences in the initial amount of organic solvent (toluene) used. Therefore, it is apparent that products made in similar ways, but using amounts of solvent intermediate between that used for Examples Nos: 1 and 2 will also be liquids.

Example No: 3
Superconducting Nanowires in Liquid Crystal S Polymers

In Example No: 3, a co-polymer is used combining links of dimethylaminoethyl-methacrylate (or dimethylaminoethyl-acrylate) and the mesogenic groups (x) shown below.

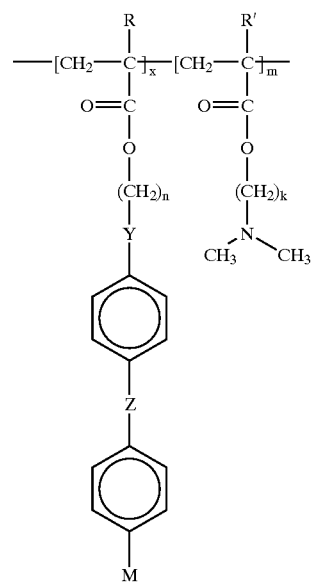

where R, R' = H; CH$_3$

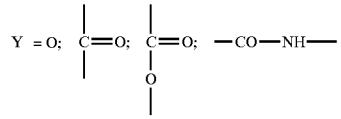

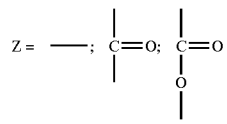

M = OCH$_3$; OC$_2$H$_5$; F; CN; NO$_2$; NH$_2$; N(CH$_3$)$_2$
n = 3, 4, 5 ... , 10
k = 2, 3, ...

In specific embodiments, we selected from the above general formula 4 specific species as follows:

TABLE IV

Organic Molecules for Superconducting Superpolarons for Embodiments 1–4

| Substituent | Embodiment 1 | Embodiment 2 | Embodiment 3 | Embodiment 4 |
|---|---|---|---|---|
| n | 4 | 5 | 8 | 6 |
| k | 2 | 2 | 2 | 3 |

TABLE IV-continued

Organic Molecules for Superconducting Superpolarons for Embodiments 1–4

| Substituent | Embodiment 1 | Embodiment 2 | Embodiment 3 | Embodiment 4 |
|---|---|---|---|---|
| R | H | H | H | H |
| R' | CH$_3$ | H | CH$_3$ | H |
| M | CN | OCH$_3$ | CN | C$_4$H$_9$ |
| Z | absent | O—C=O | absent | absent |
| Y | O | O—C=O | O | O—C=O |

The chemical structure of the mesogenic groups may vary depending on the choice of index n and substitutes Y, Z and M. Such groups included in polymer chain are known to form a polymer liquid crystal structure. The same ability is conserved in co-polymers if concentration of mesogenic groups expressed by the ratio Q=x:(x+m) is sufficiently high.

In Example No: 3, the co-polymers are treated in the same way as for Examples Nos: 1 and 2, to form quantum nanowires over a wide range of concentrations ("Q") of mesogenic groups of from 0.01 to about 1. Within the range of concentrations Q>25%, the final material analyzed near room temperature is found to combine stable nanowires with the polymer liquid crystal state occupying more than 85–90% of the volume of the material if, after partial evaporation of the solvent, the content of macromolecular substance exceeds 50 weight %.

Example No: 4
Superconducting Nanowires in Other Copolymerized Polymers

In Example No: 4, the co-polymer used comprises links of dimethylaminoethyl-methacrylate (or dimethylaminoethyl-acrylate) and links of hexylacrylate. The formation of nanowires takes place even if the content of hexylacrylate links exceeds 80%.

The material obtained in Example No: 4 differs from previous ones in two respects: a) it is amorphous, and b) At Q>80% it has a glass transition temperature below room temperature. Therefore, at room temperature it is a liquid, not a solid, and therefore has no Young's modulus.

A feature of the manufacture of certain quantum nanowires made at low concentrations (<5 weight %) of macromolecular substances in solution can be that the concentration of free electrons generated may not enough to form numbers of quantum nanowires sufficient to be detected with a magnetometer.

Therefore, at least one of the following methods can be used to increase the concentration of free electrons. First, the evaporation of excess of the solvent can be carried out as it is for making superconducting elements as described in Examples Nos: 1–4. Second, the solubility of the macromolecular substance can be decreased by adding a sedimentation agent of the polymer molecules. The chemical nature of such sedimenting agents varies from one case to another one and should be individually chosen in accordance with particular chemical structure of the polymer used. In general, relatively poor solvents can be used. For instance, instead of toluene, an alcohol such as methanol can be suitable for sedimentation of poly(acrylate)-based polymers and co-polymers.

Because sedimentation occurs in the solution, a precipitate containing macroions and free electrons is on the bottom of the flask and forms a separate sub-phase in which quantum nanowires appear. An amount of nanowires detectable using mangetometry can be obtained when the concentration of the macromolecular substance in the sub-phase exceeds about 5 weight %.

In additional products, sodium metal can be used as a dopant instead of potassium. The only difference in the methods of manufacturing quantum nanowires is that Step 1, point c) should be carried out at a temperature above 100° C., because sodium melts at 97.8° C.

D. Quantum Nanowires Made With Low Molecular Weight Organic Ions

In the materials described below, the methods of manufacture are substantially similar to those described in Examples 1–4. Therefore, in the descriptions that follow, only those details which are different are described. The absence of specific information to the contrary means that the corresponding steps are the same as for Examples 1–4.

In general, to manufacture quantum nanowires described in Examples 5–7, a medium is formed in accordance with Step 1 above, and is doped with an alkali metal in accordance with Step 1 (c), and treated according to Step 2, but does not contain macromolecular substances during the steps of forming free electrons. Macromolecular substances are formed after Step 3.

Examples Nos: 5–7

The descriptions of these three types of embodiments and methods are provided together because the only differences between them are that different organic monomers are used as starting materials to form a liquid medium. Differences in properties of intermediates and/or final products will be pointed out in appropriate places where differences between the starting materials are significant.

Step 1: Forming a Liquid Medium Comprising a Low Molecular Weight Substance and a Dopant (a) A solution for each of the embodiments described in Examples 5, 6 or 7 was made from organic monomers shown below as Nos: 1, 2, and 3 as ion forming species by adding toluene and a corresponding low molecular weight monomer listed below No: 1 (# 1; MW=431 amu), No: 2 (#2; MW=157 amu) and No: 3 (#3; MW=226 amu). The concentrations of the solutions were 8 weight %, 2.9 weight %, and 4.2 weight %, respectively, so that molar concentrations of all solutions were approximately equal. The solutions of these monomers and toluene were prepared at 65° C.

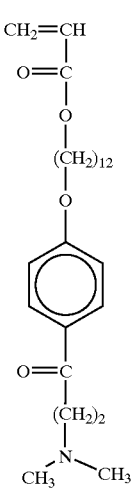

1

-continued

2

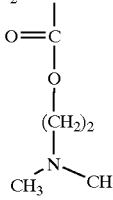

3

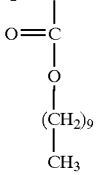

(b) Each solution was doped with sodium metal. The final concentration of sodium was between 0.1–0.5 weight %. Solutions of monomers Nos: 1 and 2 dissolved the sodium completely and easily even at about 60° C. (below the melting point of sodium), but in the solution of monomer #3 the sodium dissolved only partially even after the temperature was increased above sodium's melting point. At the end of Step 1, all three solutions had a similar pale red-brown color, indicative of the formation of complexes of the sodium dopant and the monomers.

Step 2: Generating Low Molecular Weight Ions and Free Electrons

Step 2 is carried out as for Examples Nos 1–4. Step 2 induced a more complete charge transfer reaction in the medium between the organic monomers having chemical groups with high dipole moment and the dopant, which generated low molecular weight organic ions and free electrons.

(c) Monomers Nos 1, 2 and 3 contained polar groups in their chemical structure shown above. The polar groups are ester, keto and amino groups in monomer No: 1, ester and amino groups in monomer No: 2, and an ester group in monomer No: 3. Because of the keto group in monomer No. 1, it was unnecessary to add acetone to this mixture Small amounts (about 0.1 weight %) of acetone were added to solutions Nos: 2 and 3.

(d) While stirring, the solutions were irradiated by a mercury lamp directly in glass flasks. The flasks served as an optic filter which removed the far UV part of the radiation spectrum and prevented premature polymerization. All other conditions of the illumination were the same as in the Examples Nos: 1–4 above.

After Step 2 was completed the colors of liquids in the flasks were pale yellow, indicating that a more complete charge transfer reactions had occurred, which led to ionization of low molecular weight chemicals and the appearance of free electrons in solvated form.

Step 3: Forming Quantum Nanowires

Step 3 was carried out to form a phase comprising a macromolecular substance comprising ionized chemical groups originating from the low molecular weight ions. The content in the phase greater than 5 weight % to allow free electrons to form quantum nanowires.

(e) The solutions were transferred from glass flasks to quartz flasks because quartz is transparent to the UV radiation used to initiate bulk polymerization. Before adding the solutions to the flasks, the flasks were heated for 15 min. to evaporate small amount of toluene and to remove any traces of air and/or water.

Illumination of the solutions with electromagnetic radiation was carried out, with stirring, as before using the same mercury lamp. The polymerization process took 15–18 hours to produce apparent increases of the viscosities of the solutions. The resulting visco-liquid media contained solvent, traces of non polymerized low molecular weight components and macromolecular substances, including ionized units originating from low molecular weight ions generated while Step 2.

Because of the requirement of overall electric neutrality in solution, the free electrons were present as solvated by the macromolecular substances.

(f) Magnetic measurements were carried out of samples of viscous phases collected from each step for all three materials described in Examples 5–7. Ferromagnetic signatures characteristic of quantum nanowires were found in the polymer medium made of monomer No: 1 when the starting content of monomer was greater than 5 weight %. The samples of polymer medium made of monomer No: 2 showed similar characteristics of quantum nanowires after the solvent was allowed to evaporate significantly and after the content of macromolecular substance became greater than 6–8 weight %. In both cases the average concentration of collectivized electron spins (i.e., free electrons) was between $1-2 \times 10^{18}$ cm$^{-3}$ even before complete evaporation of the solvent. In the case of samples made of monomer No: 3, the characteristic signature of quantum nanowires appeared only after the content of macromolecular substance in analyzed medium exceeded 40 weight %. That result correlates with decreased ability of monomer No; 3 to dissolve the sodium dopant during step 1.

The corresponding final amorphous polymers for materials Nos 5, 6 and 7 have different glass transitions temperatures wherein $T_g^1 > T_g^2 > T_g^3$. Each of these products was a viscous liquid, and therefore had no Young's modulus.

It can be appreciated that the descriptions of specific embodiments provided herein are for purposes of illustration only. Using the teachings of the present invention, other embodiments are possible and can be readily manufactured, and remain within the scope of this invention. Additionally, proposed mechanisms of action and theories of operability are not intended to be limiting. Rather, it is possible that other mechanisms and theories may explain the operability of this invention, and those mechanisms and theories are also included within the scope of this invention. All references cited herein are incorporated fully by reference.

Industrial Applicability

Quantum nanowires of this invention have wide applicability in the fields of electronics, semiconductor manufacture, biosensors, switches, motors and other devices for which small size and low power consumption are desirable features.

We claim:

1. A composition having at least one quantum nanowire, said quantum nanowire comprising:
   (a) a macromolecular matrix;
   (b) a source of dipoles;
   (c) a dopant; and
   (d) at least one free electron.

2. A composition having at least one quantum nanowire, said quantum nanowire comprising:
   (a) a macromolecular matrix comprising dipoles;
   (b) a dopant; and
   (c) at least one free electron.

3. The composition of claim 1, wherein at least a portion of said composition comprises at least one ion and at least one solvated free electron.

4. The composition of claim 1, wherein said quantum nanowire has a current carrying capacity greater than about $10^7$ A/cm$^2$.

5. A method for producing a quantum nanowire in a medium, comprising the steps of:
   (a) forming a viscous medium comprising a macromolecular substance comprising dipoles;
   (b) adding a dopant;
   (c) permitting a charge transfer reaction to occur between said macromolecular substance and said dopant, producing at least one ion and at least one free electron; and
   (d) permitting said macromolecular substance, said ion, said electron, and said dopant to form a quantum nanowire in said medium.

6. A method for producing a quantum nanowire in a matrix, comprising the steps of:
   (a) forming a viscous medium comprising a macromolecular substance;
   (b) adding a source of dipoles to said medium;
   (c) adding a dopant to said medium;
   (d) permitting a charge transfer reaction to occur producing at least one ion and at least one free electron in said medium; and
   (e) permitting said medium said quantum nanowire in said matrix.

7. The method of claim 6, wherein said charge transfer reaction occurs between said source of dipoles and said dopant.

8. The method of claim 5, additionally comprising the step of permitting said medium to solidify.

9. A method for producing a quantum nanowire, comprising the steps of:
   (a) forming a viscous medium comprising a low molecular weight substance;
   (b) adding a dopant;
   (c) permitting a charge transfer reaction to occur between said low molecular weight substance and said dopant, producing at least one ion and at least one free electron; and
   (d) permitting said at least one ion, said at least one electron and said medium to form a macromolecular substance and said quantum nanowire.

10. The method of claim 9 further comprising the step of adding a source of dipoles.

11. The method of claim 9, wherein the weight percent of said low molecular substance in said medium is about 5% or greater.

12. A material comprising:
   (a) an insulating matrix; and
   (b) a plurality of quantum nanowires therein having a current carrying capacity greater than about $10^7$ A/cm$^2$.

13. The material of claim 12, wherein said current carrying capacity is greater than about $10^7$ A/cm$^2$ in a temperature range of from about 0 Kelvins to the decomposition temperature of said matrix.

14. The method of claim 9, wherein in said step (d), the current carrying capacity is greater than about $10^7$ A/cm$^2$.

* * * * *